(12) United States Patent
Jeong et al.

(10) Patent No.: US 12,422,754 B2
(45) Date of Patent: Sep. 23, 2025

(54) SUBSTRATE PROCESSING APPARATUS, SEMICONDUCTOR MANUFACTURING EQUIPMENT, AND SUBSTRATE PROCESSING METHOD

(71) Applicant: Samsung Electronics Co., Ltd., Suwon-si (KR)

(72) Inventors: Jihoon Jeong, Seongnam-si (KR); Seohyun Kim, Hwaseong-si (KR); Sukhoon Kim, Seongnam-si (KR); Younghoo Kim, Yongin-si (KR); Sangjine Park, Suwon-si (KR); Kuntack Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 198 days.

(21) Appl. No.: 18/186,359

(22) Filed: Mar. 20, 2023

(65) Prior Publication Data

US 2023/0244150 A1    Aug. 3, 2023

Related U.S. Application Data

(63) Continuation of application No. 17/466,101, filed on Sep. 3, 2021, now Pat. No. 11,640,115.

(30) Foreign Application Priority Data

Sep. 4, 2020   (KR) .................. 10-2020-0113198
Dec. 29, 2020  (KR) .................. 10-2020-0186778

(51) Int. Cl.
*G03F 7/20*   (2006.01)
*G03F 7/00*   (2006.01)
*G03F 7/16*   (2006.01)

(52) U.S. Cl.
CPC ............ *G03F 7/16* (2013.01); *G03F 7/70033* (2013.01)

(58) Field of Classification Search
CPC ........ G03F 7/16; G03F 7/70033; G03F 7/427; G03F 7/325
See application file for complete search history.

(56) References Cited

U.S. PATENT DOCUMENTS 6,069,094 A    5/2000  Matsumura et al.
6,358,673 B1   3/2002  Namatsu
(Continued)

FOREIGN PATENT DOCUMENTS

KR    19980024396 A    7/1998
KR    20180037588 A    4/2018
(Continued)

OTHER PUBLICATIONS

"Request for the Submission of an Opinion", KR Application No. 10-2020-0186778, Jan. 13, 2025, 5 pp.

*Primary Examiner* — Mesfin T Asfaw
(74) *Attorney, Agent, or Firm* — Wolf, Greenfield & Sacks, P.C.

(57) ABSTRACT

A substrate processing apparatus includes a processing chamber providing a processing space for processing a substrate and processing a substrate, a substrate support configured to support the substrate, a blocking plate below the substrate support and configured to prevent supercritical fluid from being directly sprayed onto the substrate, a first supply device configured to supply supercritical fluid under a first condition to the processing chamber, a second supply device configured to supply supercritical fluid under a second condition at a higher temperature than that of supercritical fluid under the first condition to the processing chamber, a discharge device configured to discharge supercritical fluid from the processing chamber, and a control
(Continued)

device configured to control operations of the first supply device, the second supply device, and the discharge device. The control device is configured to direct the first supply device to supply supercritical fluid prior to the second supply device.

19 Claims, 27 Drawing Sheets

(56) References Cited

U.S. PATENT DOCUMENTS

| | | |
|---|---|---|
| 7,111,630 B2 | 9/2006 | Mizobata et al. |
| 2004/0020518 A1 | 2/2004 | DeYoung et al. |
| 2005/0191865 A1 | 9/2005 | Jacobson et al. |
| 2012/0048304 A1 | 3/2012 | Kitajima et al. |
| 2013/0025155 A1 | 1/2013 | Kim et al. |
| 2013/0269732 A1 | 10/2013 | Banerjee et al. |
| 2014/0290092 A1* | 10/2014 | Jung ............... B01D 53/04 34/570 |
| 2018/0096863 A1 | 4/2018 | Goshi et al. |
| 2018/0366348 A1 | 12/2018 | Cho et al. |
| 2018/0373154 A1 | 12/2018 | Choi et al. |
| 2020/0081347 A1 | 3/2020 | Choi et al. |
| 2020/0152486 A1 | 5/2020 | Kim et al. |

FOREIGN PATENT DOCUMENTS

| | | |
|---|---|---|
| KR | 20180136927 A | 12/2018 |
| KR | 20190000529 A | 1/2019 |

\* cited by examiner

SUBSTRATE PROCESSING APPARATUS, SEMICONDUCTOR MANUFACTURING EQUIPMENT, AND SUBSTRATE PROCESSING METHOD

CROSS-REFERENCE TO RELATED APPLICATIONS

This application is a continuation of U.S. patent application Ser. No. 17/466,101, filed Sep. 3, 2021, which application is based on and claims priority under 35 U.S.C. § 119 to Korean Patent Application Nos. 10-2020-0113198 and 10-2020-0186778, filed on Sep. 4, 2020 and Dec. 29, 2020, in the Korean Intellectual Property Office, the disclosures of which are incorporated by reference herein in their entireties.

BACKGROUND

The inventive concept relates to a substrate processing apparatus, semiconductor manufacturing equipment, and a substrate processing method, and more particularly, to a substrate processing apparatus, semiconductor manufacturing equipment, and a substrate processing method capable of markedly reducing generation of particles and damage of photoresist.

Miniaturization of electronic devices is continuously required. Therefore, it is required to form a fine pattern. Due to pattern destruction caused by surface tension or rotation, a process using supercritical fluid is suggested. When supercritical fluid is used, the surface tension may be remarkably reduced. However, an economical manufacturing method with high yield capable of reducing an amount of generated particles is required.

SUMMARY

The inventive concept relates to a substrate processing apparatus capable of markedly reducing generation of particles and loss of photoresist.

The inventive concept relates to semiconductor manufacturing equipment capable of markedly reducing generation of particles and loss of photoresist.

The inventive concept relates to a substrate processing method capable of markedly reducing generation of particles and loss of photoresist.

According to an aspect of the inventive concept, there is provided a substrate processing apparatus including a processing chamber providing a processing space for processing a substrate, a substrate support in the processing chamber and configured to support the substrate loaded in the processing space, a blocking plate in the processing chamber below the substrate support and configured to prevent supercritical fluid from being directly sprayed onto the substrate, a first supply device configured to supply supercritical fluid under a first condition to the processing chamber, a second supply device configured to supply supercritical fluid under a second condition at a higher temperature than that of supercritical fluid under the first condition to the processing chamber, a discharge device configured to discharge supercritical fluid from the processing chamber, and a control device configured to control operations of the first supply device, the second supply device, and the discharge device. The control device is configured to direct the first supply device to supply supercritical fluid prior to the second supply device.

According to an aspect of the inventive concept, there is provided a substrate processing apparatus including a processing chamber configured to accommodate a semiconductor substrate including a photoresist layer exposed to extreme ultraviolet (EUV) light and developer for developing the photoresist layer, a first supply device configured to supply supercritical fluid at a temperature of about 35° C. to about 70° C. and a pressure of about 75 bar to about 90 bar to the processing chamber, a second supply device configured to supply supercritical fluid at a temperature of about 70° C. to about 120° C. and a pressure of about 80 bar to about 150 bar to the processing chamber, a discharge device configured to discharge the supercritical fluid from the processing chamber, a control device configured to control operations of the first supply device, the second supply device, and the discharge device, and a preprocessing device configured to preprocess the processing chamber. The control device is configured to perform a cycle of pressurizing and depressurizing the processing chamber 2 to 15 times.

According to an aspect of the inventive concept, there is provided semiconductor manufacturing equipment including a transfer device configured to transfer a substrate between chamber modules configured to perform a unit process, a first chamber module configured to coat photoresist on a surface of the substrate, at least one second chamber module configured to bake the photoresist on the substrate, a third chamber module configured to irradiate extreme ultraviolet (EUV) light onto the photoresist on the substrate using a photo mask to expose the photoresist, a fourth chamber module configured to provide developer onto a surface of the exposed photoresist, and a fifth chamber module configured to receive the substrate from the fourth chamber module and to sequentially supply supercritical fluid at a first temperature and supercritical fluid at a second temperature different from the first temperature to the substrate.

According to an aspect of the inventive concept, there is provided a substrate processing method including receiving a substrate including an extreme ultraviolet (EUV) photoresist layer exposed to EUV light and developer for developing the EUV photoresist layer into a processing chamber, supplying supercritical fluid under a first condition to the processing chamber, and supplying supercritical fluid under a second condition to the processing chamber. The supplying of supercritical fluid under the first condition is performed before the supplying of supercritical fluid under the second condition. A temperature of supercritical fluid under the first condition is lower than that of supercritical fluid under the second condition.

According to an aspect of the inventive concept, there is provided a substrate processing method including forming a to-be-etched layer and an antireflection layer on a substrate, forming an extreme ultraviolet (EUV) photoresist layer on the substrate, exposing the EUV photoresist layer to EUV light using a photo mask, providing developer onto the exposed EUV photoresist layer and placing the substrate in a processing chamber, supplying supercritical fluid under a first condition to the processing chamber, supplying supercritical fluid under a second condition at a temperature higher than that of supercritical fluid under the first condition to the processing chamber, forming a photoresist pattern by drying the substrate by supercritical fluid under the second condition, and forming a pattern in the to-be-etched layer by performing etching using the photoresist pattern as an etching mask. A width of the pattern formed in the to-be-etched layer is about 5 nm to about 20 nm.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
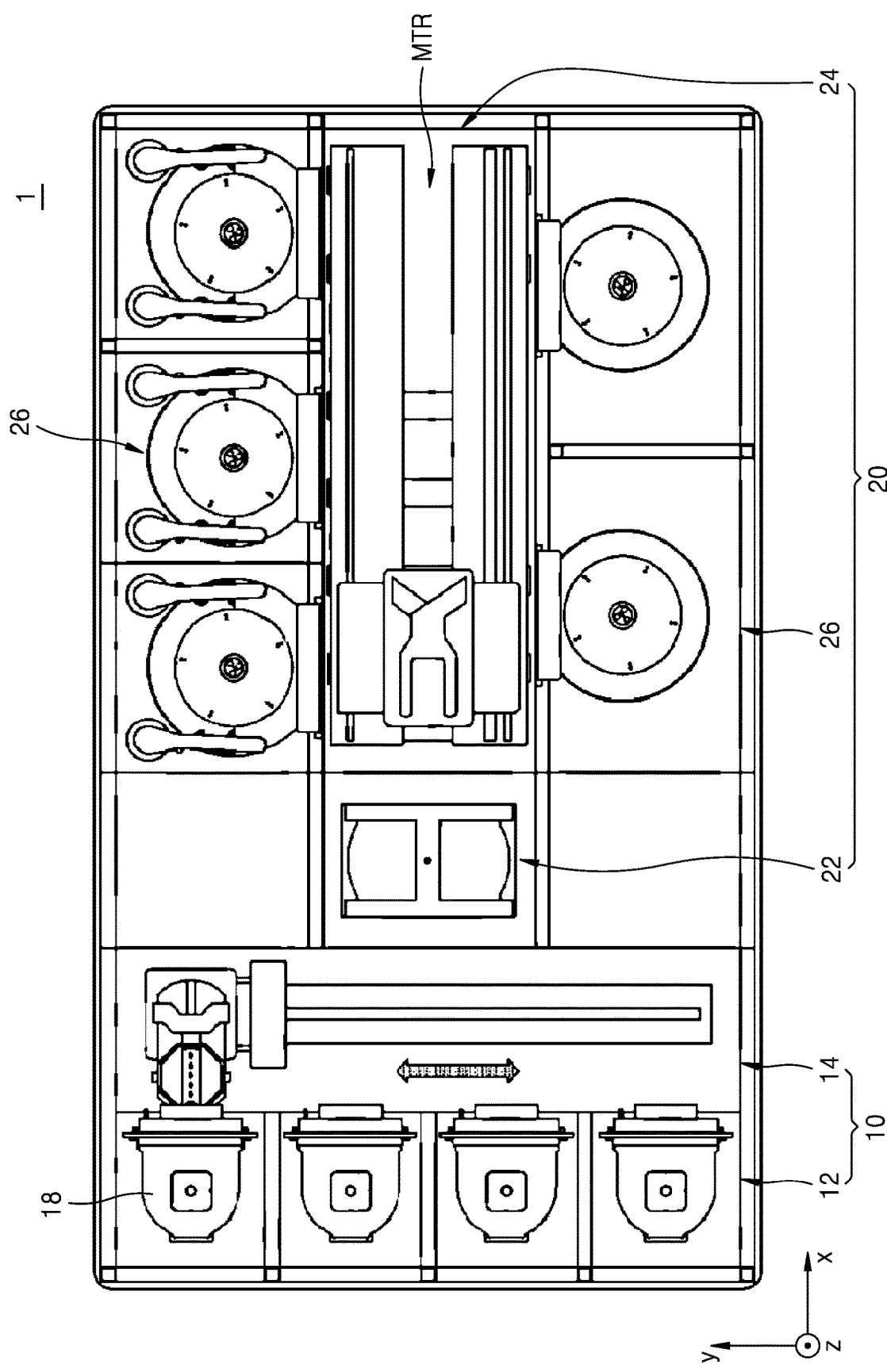
FIG. 1 is a plan view illustrating an embodiment of semiconductor manufacturing equipment.

Hereinafter, embodiments of the inventive concept will be described in detail with reference to the accompanying drawings. Like reference numerals refer to like elements throughout.

FIG. 1 is a plan view illustrating an embodiment of semiconductor manufacturing equipment 1.

Referring to FIG. 1, the semiconductor manufacturing equipment 1 may include an index module 10 and a process processing module 20. The index module 10 may include loading ports 12 and a transfer frame 14. In some embodiments, the loading ports 12, the transfer frame 14, and the process processing module 20 may be sequentially arranged in line.

Carriers 18 in which substrates are accommodated are settled in the loading ports 12. Front opening unified pods (FOUP) may be used as the carriers 18. The loading ports 12 may be provided in plural. The number of loading ports 12 may increase or decrease in accordance with process efficiency and footprint condition of the process processing module 20. A plurality of slots for accommodating substrates to be horizontal to the ground are formed in the carriers 18.

The process processing module 20 may include a buffer unit 22, a transfer chamber 24, and a plurality of chamber modules 26. The plurality of chamber modules 26 may be arranged at both sides of the transfer chamber 24. In some embodiments, at one side and the other side of the transfer chamber 24, the plurality of chamber modules 26 may be symmetrical to one another based on the transfer chamber 24.

In some embodiments, at one side of the transfer chamber 24, the plurality of chamber modules 26 are provided. Some of the plurality of chamber modules 26 may be arranged in a longitudinal direction of the transfer chamber 24. In addition, some of the plurality of chamber modules 26 may be stacked with one another. For example, at one side of the transfer chamber 24, the plurality of chamber modules 26 may be arranged with an array of A×B. Here, A is the number of chamber modules 26 provided in line in an x direction and B is the number of chamber modules 26 provided in line in a z direction. When four or six chamber modules 26 are provided at both sides of the transfer chamber 24, the four or six chamber modules 26 may be arranged with an array of 2×2 or 3×2. The number of chamber modules 26 may increase or decrease. In some embodiments, the plurality of chamber modules 26 may be provided only at one side of the transfer chamber 24. In addition, in some embodiments, the plurality of chamber modules 26 may be provided at one side or both sides of the transfer chamber 24 in a single layer. In some embodiments, at one side of the transfer chamber 24 in the x direction, and an additional chamber module facing the buffer unit 22 may be provided, which will be described in more detail with reference to FIG. 2.

The buffer unit 22 is arranged between the transfer frame 14 and the transfer chamber 24. The buffer unit 22 provides a space in which a substrate stays before the substrate is returned between each of the plurality of chamber modules 26 and the carriers 18. The transfer frame 14 returns the substrate between each of the carriers 18 settled in the loading ports 12 and the buffer unit 22.

The transfer chamber 24 may include a transfer device MTR that returns a substrate between the buffer unit 22 and each of the plurality of chamber modules 26 and between the plurality of chamber modules 26.

Figure 2:
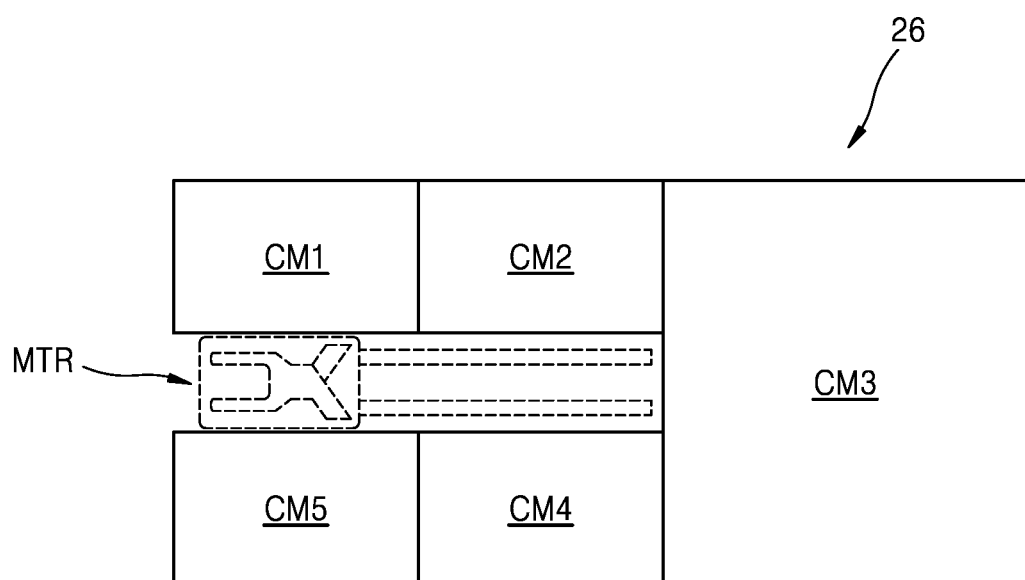
FIG. 2 is a block diagram conceptually illustrating layout of example chamber modules.

FIG. 2 is a block diagram conceptually illustrating layout of example chamber modules 26.

Referring to FIG. 2, the chamber modules 26 may include a first chamber module CM1 for coating photoresist on a surface of a received substrate.

The substrate may be, for example, a semiconductor substrate. In some embodiments, the semiconductor substrate may be or include a semiconductor such as silicon (Si) or germanium (Ge) or a compound semiconductor such as silicon germanium (SiGe), silicon carbide (SiC), gallium arsenide (GaAs), indium arsenide (InAs), or indium phosphide (InP).

Photoresist coated on the surface of the substrate may be a photosensitive polymer material of which chemical property changes by being exposed to extreme ultraviolet (EUV) light having a wavelength of 13.5 nm or a wavelength less than 11 nm.

In some embodiments, photoresist may include, for example, (meth)acrylate polymer. (Meth)acrylate polymer may be aliphatic (meth)acrylate polymer and may include, for example, polymethylmethacrylate (PMMA), poly(t-butylmethacrylate), poly(methacrylic acid), poly(norbornyl-methacrylate), binary or terpolymer of repeating units of the above (meth)acrylate polymer components, or combinations thereof.

The photoresist may be a polymer including repeating units combined with a protecting group that may be deprotected by exposure, which will be described below. The protecting group as a functional group that may be decomposed by acid may be selected from, for example, tert-butoxycarbonyl (t-BOC), isonorbornyl, 2-methyl-2-adamantyl, 2-ethyl-2-adamantyl, 3-tetrahydrofuranyl, 3-oxocyclohexyl, γ-butyllactone-3-yl, mavaloniclactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-butoxycarbonylmethyl, methoxymethyl, ethoxymethyl, trimethoxysilyl, and triethoxysilyl. However, the inventive concept is not limited thereto.

Photoresist layer may be formed by, for example, a spin coating method, a spray coating method, or a deep coating method to a thickness of, for example, about 30 nm to about 150 nm.

The chamber modules 26 may include at least one second chamber module CM2 for baking the photoresist layer on the substrate. In the second chamber module CM2, the photoresist layer may be baked at a temperature of about 80° C. to about 130° C. for about 40 seconds to about 100 seconds.

The chamber modules 26 may include a third chamber module CM3 configured to irradiate EUV onto the photoresist layer on the substrate using a photo mask.

Figure 3:
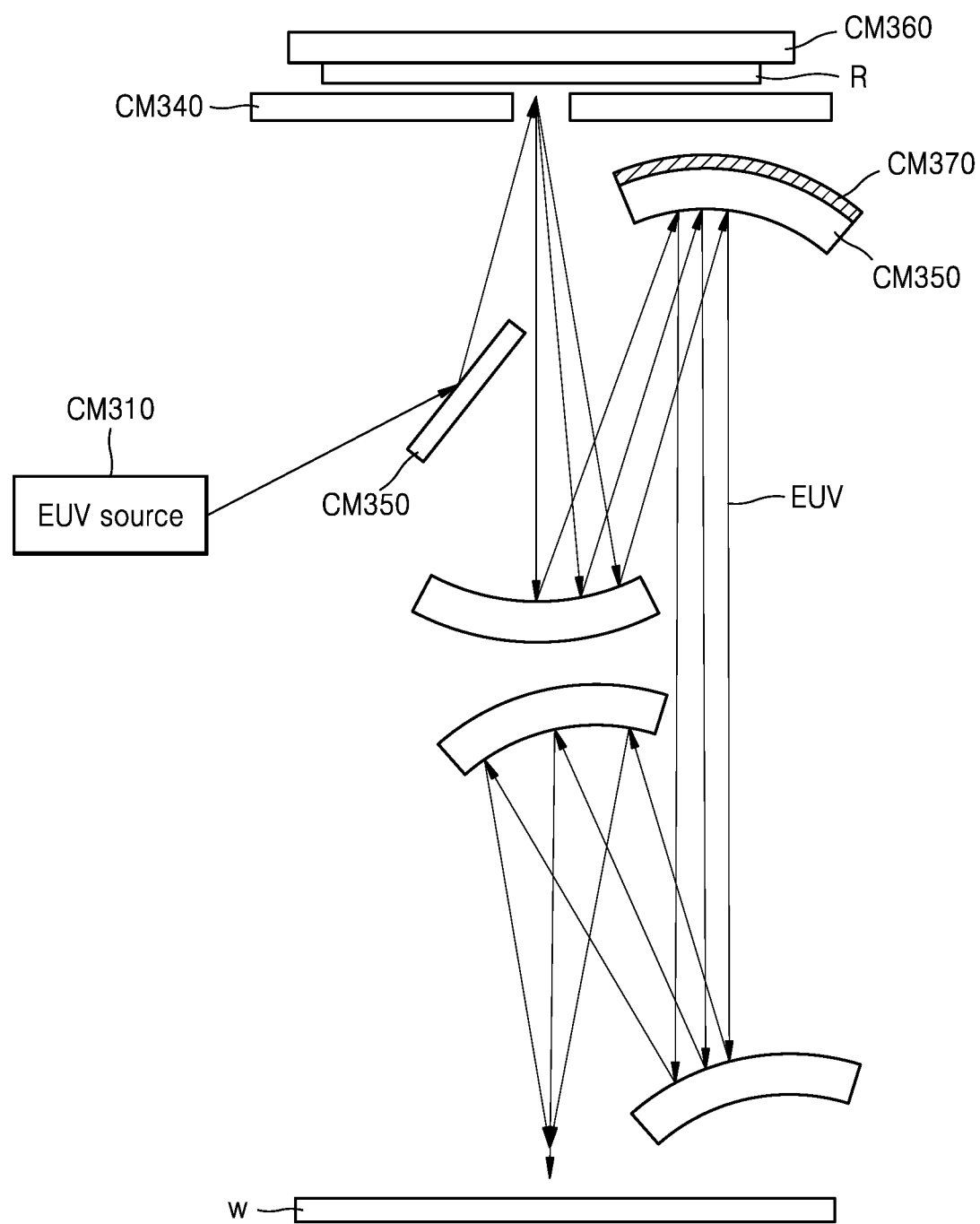
FIG. 3 is a schematic diagram illustrating extreme ultraviolet (EUV) exposure performed on a photoresist layer on the substrate in the third chamber module of FIG. 2.

FIG. 3 is a schematic diagram illustrating EUV exposure performed on a photoresist layer on the substrate in the third chamber module CM3.

Referring to FIG. 3, a light source CM310 providing EUV for exposure is provided in the third chamber module CM3. On a reflective mask R in which a circuit pattern to be transcribed onto a substrate w is implemented as a mask pattern, a slit CM340 limiting a magnitude of EUV light for exposure may be provided. The EUV light for exposure may be incident on a surface of the reflective mask R through the slit CM340. The incident EUV light is reflected from the surface of the reflective mask R with an image of the mask pattern.

In order to provide an optical path through which the reflected EUV light reaches the substrate w, an optical system in which a plurality of reflective lenses CM350 are combined with one another may be provided. In some embodiments, the proper number of reflective lenses CM350 are combined with one another so that the optical path transmitting reflected exposed light with the pattern image onto the substrate w may be provided.

In some embodiments, the reflective mask R may be mounted on a mask stage CM360. In addition, the mask stage CM360 may include a cooling unit for cooling the mounted reflective mask R, for example, by the Peltier effect.

In addition, a lens cooling unit CM370 for cooling the plurality of reflective lenses CM350, for example, by the Peltier effect may be provided behind at least one of the plurality of reflective lenses CM350.

Referring to FIG. 2 again, the chamber modules 26 may include a fourth chamber module CM4 for providing developer to a surface of exposed photoresist.

The developer may be provided to the surface of photoresist by the spin coating method.

The developer may be, for example, a nonpolar organic solvent. For example, the developer may selectively remove a soluble zone of photoresist. In some embodiments, the developer may include aromatic hydrocarbon, cyclohexane, cyclohexanone, acyclic or cyclic ethers, acetates, propionates, butyrates, lactates, or combinations thereof. For example, n-butyl acetate (nBA), propylene glycol methyl ether (PGME), propylene glycol methyl ether acetate (PG-MEA), γ-butyrolactone (GBL), or isopropanol (IPA) may be used as the developer.

The chamber modules 26 may include a fifth chamber module CM5 for receiving the substrate from the fourth chamber module CM4 and sequentially supplying supercritical fluid at a first temperature and supercritical fluid at a second temperature different from the first temperature to the received substrate.

Figure 4:
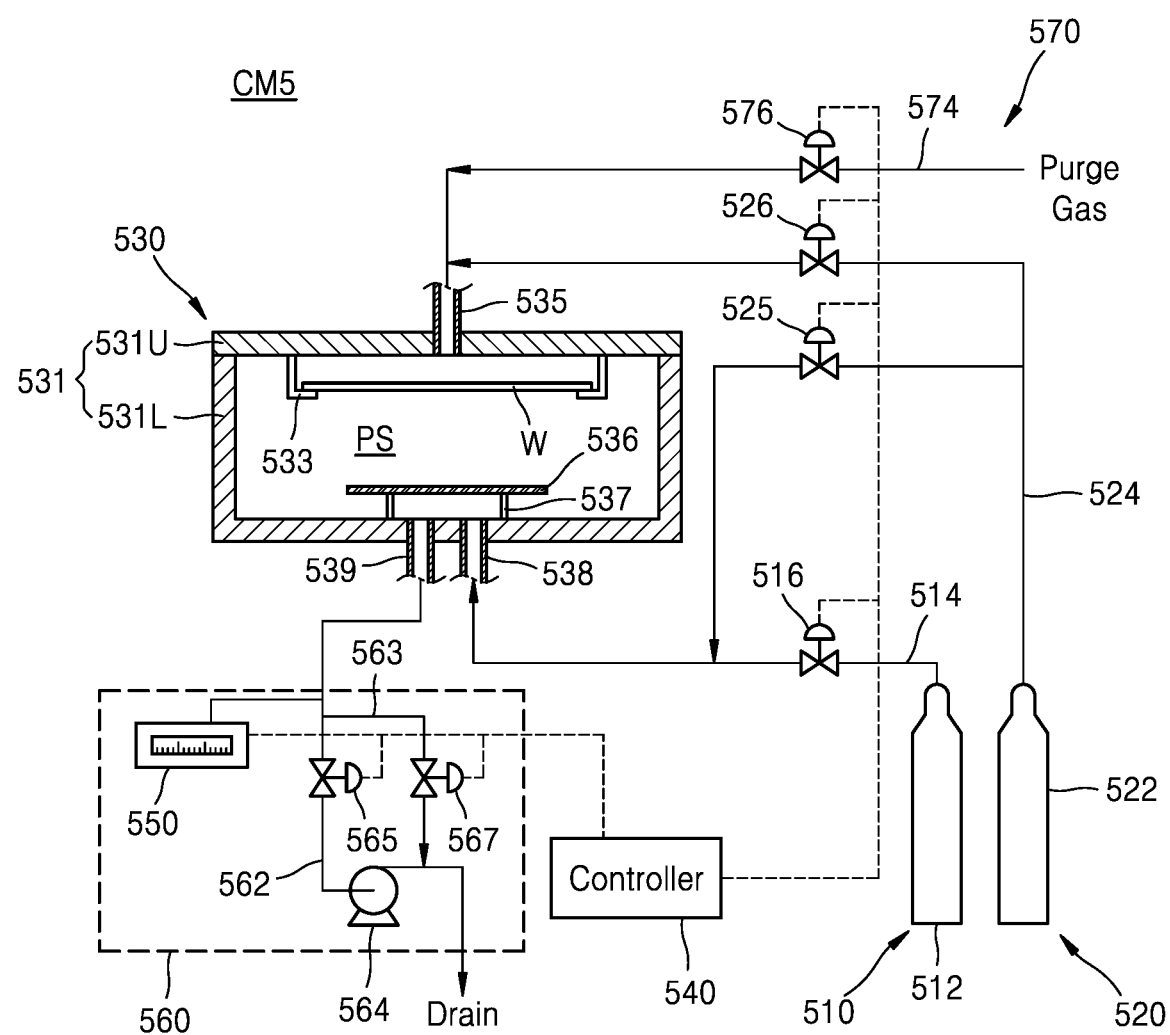
FIG. 4 is a schematic diagram illustrating a fifth chamber module according to an embodiment of the inventive concept.

FIG. 4 is a schematic diagram illustrating a fifth chamber module CM5 according to an embodiment of the inventive concept.

Referring to FIG. 4, the fifth chamber module CM5 may include a processing chamber 530 for processing the substrate w, a first supply device 510 for supplying supercritical fluid under a first condition to the processing chamber 530, a second supply device 520 for supplying supercritical fluid under a second condition to the processing chamber 530, a discharge device 560 for discharging the supercritical fluid from the processing chamber 530, and a controller 540 for controlling operations of the first supply device 510, the second supply device 520, and the discharge device 560.

The processing chamber 530 may include a vessel 531, a support 533 for supporting the substrate w, and a blocking plate 536.

The vessel 531 may provide a processing space PS in which the substrate w may be processed. For example, in the processing space PS, a process of drying the substrate w by using supercritical fluid may be performed. The vessel 531 may include a material that may endure high pressure of no less than critical pressure of supercritical fluid.

The vessel 531 may include an upper vessel 531U, a lower vessel 531L, a first supply port 538, a second supply port 535, and an exhaust port 539.

The upper vessel 531U and the lower vessel 531L may be combined with each other to be opened and closed so that the vessel 531 goes back and forth between a position in which the processing space PS is closed and a position in which the processing space PS is open to the air. In some embodiments, the lower vessel 531L may form a space of which a top is open and the upper vessel 531U may be combined with the top of the lower vessel 531L to cover the space of the lower vessel 531L. In this case, the upper vessel 531U may generally be configured as an upper wall of the vessel 531 and the lower vessel 531L may generally be configured as a bottom wall and side walls of the vessel 531. In other embodiments, the upper vessel 531U may generally be configured as the upper wall and side walls of the vessel 531 and the lower vessel 531L may generally be configured as the bottom wall of the vessel 531. Alternatively, the upper vessel 531U and the lower vessel 531L may be configured as the side walls of the vessel 531.

In some embodiments, the vessel 531 may go back and forth between the position in which the processing space PS is closed and the position in which the processing space PS is open to the air by an elevating member ascending or descending the upper vessel 531U and/or the lower vessel 531L, a driving member driving movements of the upper vessel 531U and the lower vessel 531L, and a controller controlling the movements of the upper vessel 531U and the lower vessel 531L.

The blocking plate 536 may prevent supercritical fluid supplied through the first supply device 510 and the second supply device 520 from being directly sprayed onto the substrate w. For example, the blocking plate 536 may be arranged between the first supply port 538 and a substrate support 533 and may prevent supercritical fluid sprayed from the first supply port 538 from being directly sprayed onto the substrate w supported by the substrate support 533. For example, supercritical fluid sprayed from the first supply port 538 and reaching the blocking plate 536 may reach the substrate w supported by the substrate support 533 after moving along a surface of the blocking plate 536.

The blocking plate 536 may have a shape corresponding to the substrate w. For example, the blocking plate 536 may be disk-shaped. The blocking plate 536 may have a radius equal to or greater than that of the substrate w in order to effectively prevent supercritical fluid from being directly sprayed onto the substrate w. Alternatively, the blocking plate 536 may have a radius less than that of the substrate w so that supercritical fluid may easily reach the substrate w.

In some embodiments, the blocking plate 536 may be arranged on the lower vessel 531L and may be spaced apart from a surface of the lower vessel 531L by a predetermined distance by a support 537. The first supply port 538 and/or the exhaust port 539 formed in the lower vessel 531L may vertically overlap or align with the blocking plate 536. In this case, the blocking plate 536 may have supercritical fluid sprayed from the first supply port 538 reach the substrate w supported by the substrate support 533 with a predetermined stream along the surface of the blocking plate 536. In addition, the blocking plate 536 may have supercritical fluid in the processing chamber 530 exhausted through the exhaust port 539 with a predetermined stream from the surface of the blocking plate 536 to the exhaust port 539.

In some embodiments, the first supply device 510 may include a first storage tank 512 maintaining supercritical fluid under the first condition, a first supply conduit 514 connecting the first storage tank 512 to the processing chamber 530, and a first control valve 516 for controlling flow of supercritical fluid flowing through the first supply conduit 514.

In some embodiments, the second supply device 520 may include a second storage tank 522 maintaining supercritical fluid under the second condition, a second supply conduit 524 connecting the second storage tank 522 to the processing chamber 530, and a second control valve 526 and a third control valve 525 for controlling flow of supercritical fluid flowing through the second supply conduit 524.

Figure 5:
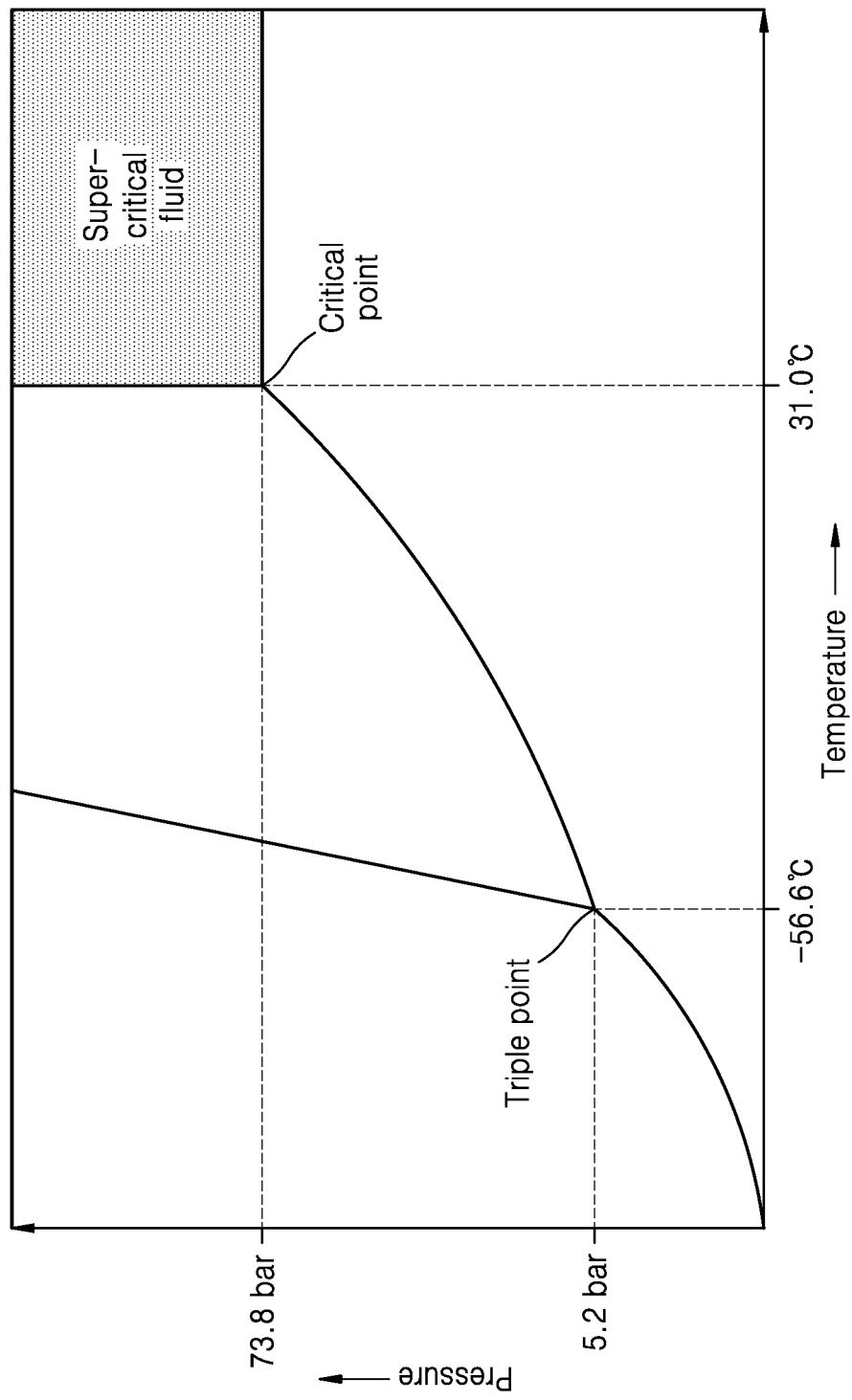
FIG. 5 is a phase diagram of carbon dioxide ($CO_2$)

Supercritical fluid may be carbon dioxide ($CO_2$) in a supercritical state. FIG. 5 is a phase diagram of carbon dioxide ($CO_2$).

Referring to FIG. 5, a temperature of a triple point of $CO_2$ is −56.6° C. and pressure of a triple point of $CO_2$ is 5.1 bar. In addition, a critical temperature of $CO_2$ is 31.0° C. and critical pressure of $CO_2$ is 73.8 bar. Because the critical temperature and critical pressure of $CO_2$ are low, it is easy and low-priced to have $CO_2$ in the supercritical state. In addition, $CO_2$ is non-toxic to be harmless to human body, is nonflammable, and is chemically inert. Because a diffusion coefficient of $CO_2$ in the supercritical state is about 10 to 100 times greater than that of water or another organic solvent, $CO_2$ in the supercritical state may rapidly permeate and easily replace the organic solvent and, because $CO_2$ in the supercritical state rarely has surface tension, $CO_2$ in the supercritical state may be advantageously used for drying a substrate with a fine circuit pattern. $CO_2$ may be obtained by reutilizing a byproduct of various chemical reactions and, when $CO_2$ is changed into a gas to be separated from the organic solvent after being used for a supercritical drying process, the organic solvent may be easily reutilized, which is environment-friendly.

As illustrated in FIG. 5, a state with a temperature and pressure greater than a critical temperature and critical pressure is referred to as the supercritical state similar to a gas, for example, as described above, with very low surface tension and similar to a liquid, for example, with high cleaning power and substitution power.

The first condition and the second condition are supercritical states and the first condition and the second condition are different from each other in at least one of a temperature and pressure. The temperature of the second condition is higher than that of the first condition, which will be described in more detail hereinafter.

Figure 6:
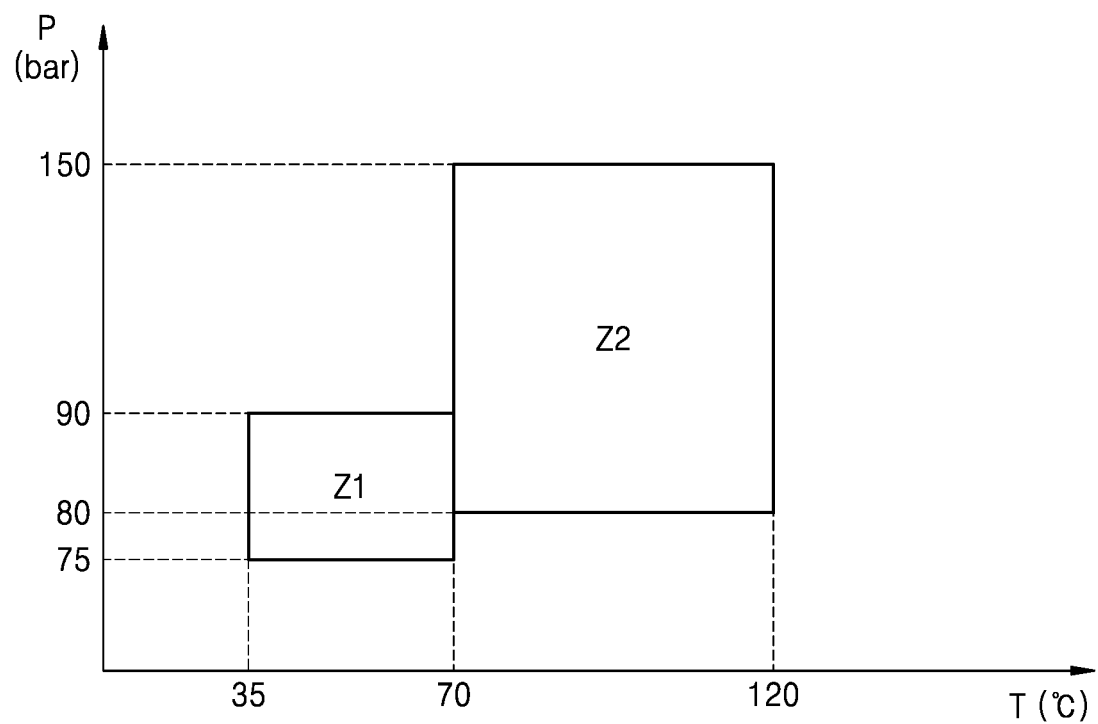
FIG. 6 is a chart illustrating a first condition and a second condition on a temperature-pressure coordinate plane.

FIG. 6 is a chart illustrating a first condition and a second condition on a temperature-pressure coordinate plane. A horizontal axis and a vertical axis of FIG. 6 are not scaled in proportion to numbers.

Referring to FIG. 6, the temperature of the first condition may be about 35° C. to about 70° C. and the pressure of the first condition may be about 75 bar to about 90 bar, which may be defined as an arbitrary state in a first zone Z1. In addition, the temperature of the second condition may be about 70° C. to about 120° C. and the pressure of the second condition may be about 80 bar to about 150 bar, which may be defined as an arbitrary state in a second zone Z2.

Referring to FIG. 4 again, the first supply conduit 514 may be connected to a bottom of the processing chamber 530 and the second supply conduit 524 may be connected to a top of the processing chamber 530.

In some embodiments, the first supply conduit 514 may be connected to the top of the processing chamber 530 and the second supply conduit 524 may be connected to the bottom of the processing chamber 530. In some embodiments, the first supply conduit 514 and the second supply conduit 524 may be connected to the bottom of the processing chamber 530. In some embodiments, the first supply conduit 514 and the second supply conduit 524 may be connected to the top of the processing chamber 530.

The discharge device 560 may include an exhaust pump 564 for forcibly discharging fluid in an internal space of the processing chamber 530 and a first discharge conduit 562 connected to the exhaust pump 564. In addition, the discharge device 560 may include a second discharge conduit 563 through which fluid in the internal space of the processing chamber 530 may be voluntarily or passively discharged.

A fourth control valve 565 and a fifth control valve 567 for controlling flow of fluid flowing through the first discharge conduit 562 and the second discharge conduit 563 may be respectively provided in the first discharge conduit 562 and the second discharge conduit 563.

The discharge device 560 may further include a concentration measuring device 550 for measuring concentration of developer in an exit of the processing chamber 530.

The fifth chamber module CM5 may further include a purge gas supply device 570 for supplying a purge gas to the processing chamber 530.

The purge gas supply device 570 may supply the purge gas from an external purge gas source to the processing chamber 530 through a purge gas supply conduit 574. In FIG. 4, it is illustrated that the purge gas and supercritical fluid supplied through the second supply conduit 524 are supplied in the same manifold and then, are received to the processing chamber 530. However, the inventive concept is not limited thereto. In some embodiments, the purge gas supply conduit 574 may be directly connected to the processing chamber 530 so that the purge gas may be directly supplied to the processing chamber 530.

The purge gas may be an arbitrary inert gas or an arbitrary gas with remarkably low chemical activity such as helium (He), neon (Ne), argon (Ar), or nitrogen ($N_2$). A sixth control valve 576 for controlling flow of the purge gas flowing through the purge gas supply conduit 574 may be provided in the purge gas supply conduit 574.

The first, second, third, fourth, fifth, and sixth control valves 516, 526, 525, 565, 567, and 576 may be connected to a controller or control device 540 so that opening and closing thereof may be controlled. The control device 540 may include a hardware/software combination such as hardware including a logic circuit and processor executing software or a processing circuitry such as the hardware/software combination. For example, more specifically, the processing circuitry may include a central processing unit (CPU), an arithmetic logic unit (ALU), a digital signal processing unit, a microcomputer, a system-on-chip (SoC), a field programmable gate array (FPGA), a programmable logic unit, a microprocessor, or an application-specific integrated circuit (ASIC). However, the inventive concept is not limited thereto.

In some embodiments, the control device 540 may control the semiconductor manufacturing equipment 1 of FIG. 1. In some embodiments, the control device 540 may be a slave control device connected to a master control device by using a control device controlling the semiconductor manufacturing equipment 1 of FIG. 1 as the master control device. In some embodiments, the control device 540 may be connected to the control device controlling the semiconductor manufacturing equipment 1 of FIG. 1 by a cascade method.

Hereinafter, the supply of supercritical fluid and the purge gas to the processing chamber 530 and the discharge of fluid from the processing chamber 530 are controlled by the control device 540 unless otherwise mentioned.

Figure 7:
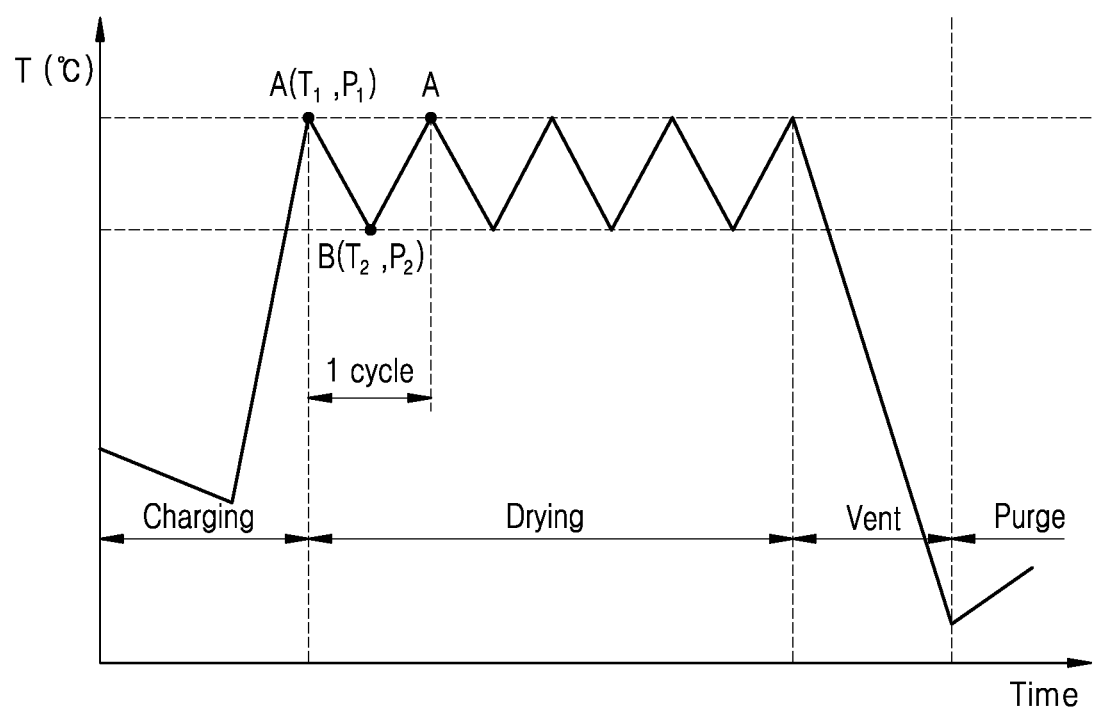
FIG. 7 is a schematic chart illustrating an embodiment of a method of supplying supercritical fluid in order to wash, remove, and dry developer after developing photoresist on the substrate, which is exposed by EUV.

FIG. 7 is a schematic chart illustrating an embodiment of a method of supplying supercritical fluid in order to wash, remove, and dry developer after developing photoresist on the substrate w, which is exposed by EUV.

Referring to FIGS. 4 and 7, supercritical fluid under the first condition is supplied from the first supply device 510 to the processing chamber 530. At this time, due to adiabatic expansion, a temperature of supercritical fluid may be slightly reduced. In order to supply supercritical fluid under the first condition from the first supply device 510 to the processing chamber 530, the control device 540 may open the first control valve 516.

At this time, developer is partially removed and the removed developer may be transmitted to supercritical fluid. In addition, supercritical fluid may be partially diffused into developer. Because developer described above with reference to FIG. 2 has high miscibility with $CO_2$, $CO_2$ in the supercritical state may be easily diffused into developer.

By performing the above process, concentration of developer in a layer of developer provided on the surface of photoresist may be reduced. When supercritical fluid at a low temperature (that is, under the first condition) is not supplied but supercritical fluid at a high temperature (that is, under the second condition) is supplied, a large amount of photoresist may be unnecessarily removed in a state in which concentration of developer is high (therefore, activity of developer is still high) and a frequency of generation of organic particles may increase.

Then, supercritical fluid under the second condition is supplied from the second supply device 520 to the processing chamber 530. Because a temperature and pressure of the processing chamber 530 under the second condition are higher than those under the first condition, the temperature and pressure of the processing chamber 530 may steadily increase. In order to supply supercritical fluid under the second condition from the second supply device 520 to the processing chamber 530, the control device 540 may close the first control valve 516 and may open the third control valve 525. In this case, supercritical fluid under the second condition may be supplied to the processing space PS through the first supply port 538 provided in the bottom of the processing chamber 530.

In some embodiments, in order to supply supercritical fluid under the second condition from the second supply device 520 to the processing chamber 530, the control device 540 may close the first control valve 516 and may open the second control valve 526.

When the temperature and pressure of the processing chamber 530 reach a state A, in order to reduce pressure of the processing chamber 530, the fifth control valve 567 may be opened. When the fifth control valve 567 may be open, because the pressure of the processing chamber 530 is high, fluid in the processing chamber 530 may be voluntarily discharged through the second discharge conduit 563. As fluid in the processing chamber 530 is discharged, the pressure of the processing chamber 530 is reduced and, due to adiabatic expansion, the temperature of the processing chamber 530 is reduced so that the temperature and pressure of the processing chamber 530 may reach a state B.

That is, a temperature $T_2$ in the state B is lower than a temperature $T_1$ in the state A and pressure $P_2$ in the state B is lower than pressure $P_1$ in the state A.

Then, when the temperature and pressure of the processing chamber 530 reach the state B, the fifth control valve 567 is closed and supercritical fluid under the second condition is supplied from the second supply device 520 to the processing chamber 530. Supercritical fluid may be supplied until the temperature and pressure of the processing chamber 530 reach the state A (or vicinity of the state A) and the temperature and pressure of the processing chamber 530 may increase. At this time, in order to supply supercritical fluid under the second condition from the second supply device 520 to the processing chamber 530, the control device 540 may close the fifth control valve 567 and may open the second control valve 526.

As illustrated in FIG. 7, transition from the state A to the state B and then, to the state A may be defined as one cycle. While the cycle is repeatedly performed no less than two times, developer may be completely removed by supercritical fluid at a high temperature. Because concentration of developer is reduced by supercritical fluid at a low temperature (that is, under the first condition), although supercritical fluid at a high temperature is supplied, activity of developer is limited. Therefore, a degree of additional removal of photoresist is insignificant and, as a result, generation of organic particles may be markedly reduced.

In addition, supercritical fluid mixed with vaporized developer is discharged (the state A→the state B) and pure supercritical fluid is additionally supplied (the state B→the state A) so that developer may be continuously vaporized toward supercritical fluid and removed.

In order to completely remove developer on the substrate, the cycle may be performed 2 to 15 times. When the cycle is performed only once, developer may not be completely removed and may remain. Because 15 times of cycle is enough to completely remove developer on the substrate, when the cycle is performed more than 15 times, manufacturing cost increases, which is uneconomical.

It may take about 3 seconds to about 20 seconds to perform the cycle once. When it takes too short to perform the cycle once, a time required for removing developer is not secured so that the number of cycles required for removing developer may increase. When it takes too long to perform the cycle once, it takes longer to perform manufacturing, which is uneconomical.

Figure 8:
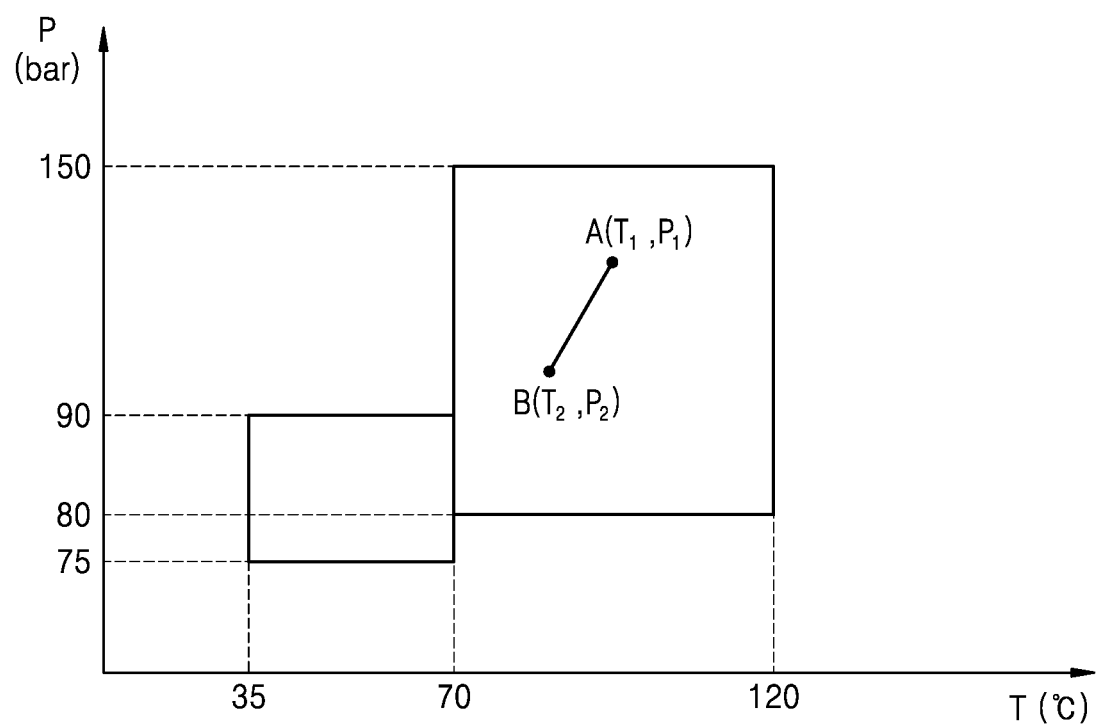
FIGS. 8 and 9 are charts schematically illustrating cycle configurations according to embodiments of the inventive concept.
Figure 9:
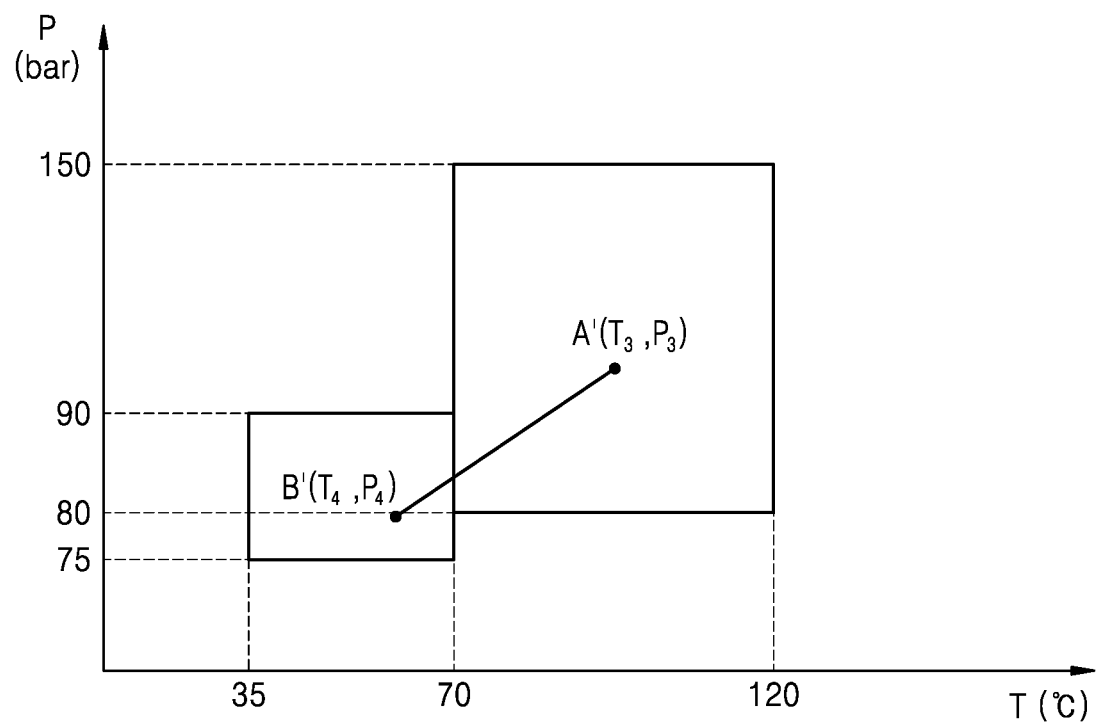

FIGS. 8 and 9 are charts schematically illustrating cycle configurations according to embodiments of the inventive concept.

First, referring to FIG. 8, the cycle may go back and forth between the state A with the first temperature $T_1$ and the first pressure $P_1$ and the state B with the second temperature $T_2$ and the second pressure $P_2$. At this time, the state A and the state B may be determined to belong to the second zone Z2 (refer to FIG. 6).

Referring to FIG. 9, the cycle may go back and forth between a state A' with a third temperature $T_3$ and third pressure $P_3$ and a state B' with a fourth temperature $T_4$ and fourth pressure $P_4$. At this time, the state A' may be determined to belong the second zone Z2 (refer to FIG. 6) and the state B' may be determined to belong to the first zone Z1 (refer to FIG. 6).

Referring to FIGS. 4 and 7, then, fluid in the processing chamber 530 may be removed. In order to remove fluid from the internal space of the processing chamber 530, the fifth control valve 567 may be opened. Then, when the pressure of the internal space of the processing chamber 530 is reduced to some degree, the fourth control valve 565 may be opened and the exhaust pump 564 may be driven so that fluid may be removed from the internal space of the processing chamber 530. In some embodiments, the fourth control valve 565 and the fifth control valve 567 may be simultaneously opened and the exhaust pump 564 may be immediately driven so that fluid may be rapidly removed from the internal space of the processing chamber 530.

In order to determine whether developer is sufficiently removed, concentration of developer may be measured by using the concentration measuring device 550. That is, when concentration of developer measured by the concentration measuring device 550 is higher than an allowable value, the sixth control valve 576 may be opened so that the purge gas may be supplied to the processing chamber 530. The purge gas may be supplied until concentration of developer measured by the concentration measuring device 550 is lower than the allowable value.

Figure 10A:
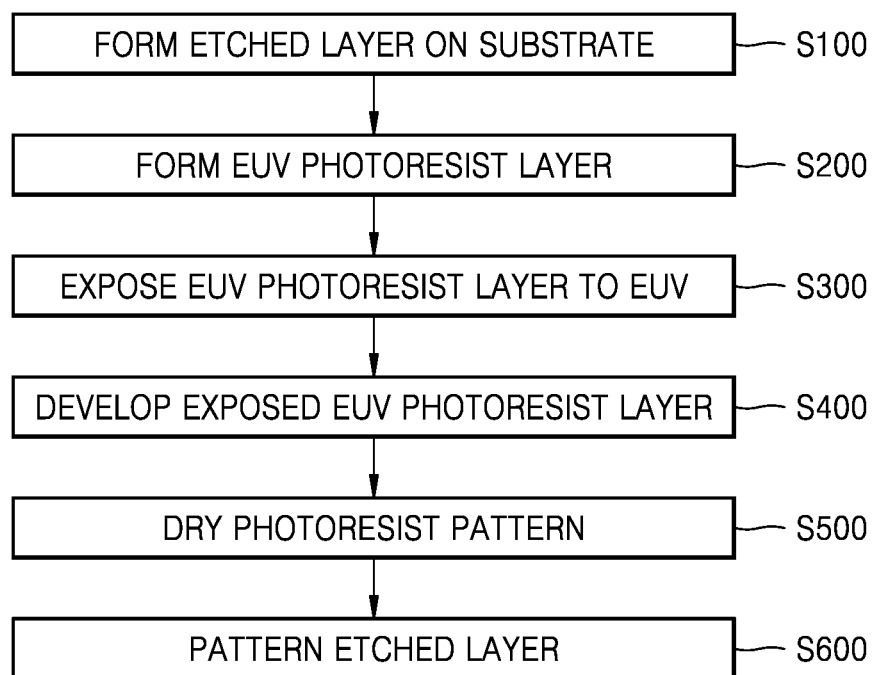
FIG. 10A is a flowchart illustrating an embodiment of a method of forming a patterned material layer on a substrate.
Figure 10B:
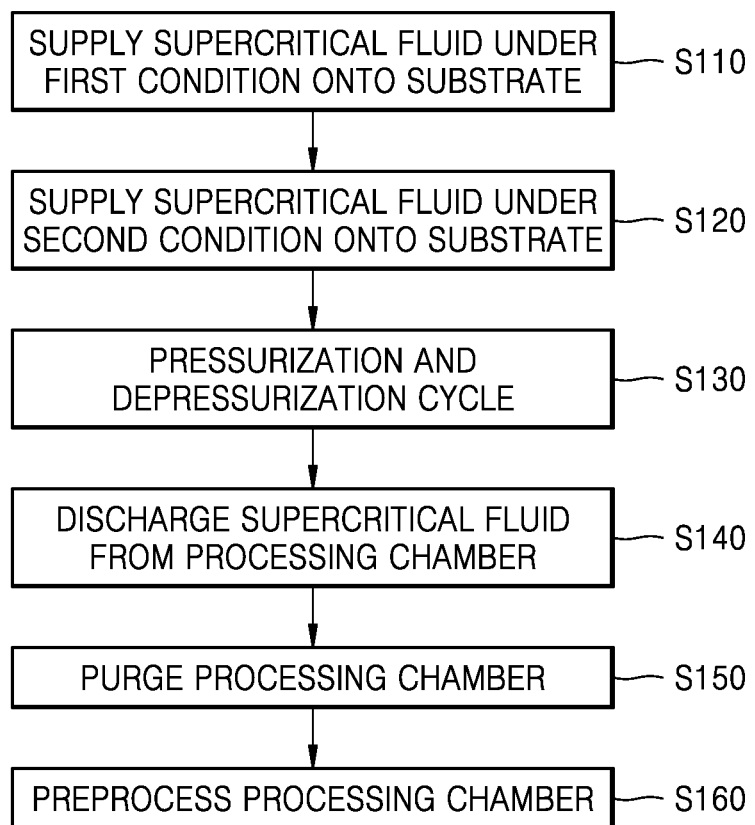
FIG. 10B is a flowchart illustrating an embodiment of a processing method of a substrate processing apparatus removing and drying developer.

FIG. 10A is a flowchart illustrating an embodiment of a method of forming a patterned material layer on a substrate and FIG. 10B is a flowchart illustrating an embodiment of a processing method of a substrate processing apparatus removing and drying developer. FIGS. 11A to 11J are side sectional views illustrating an embodiment of a method of forming a patterned material layer on a substrate.

Figure 11A:
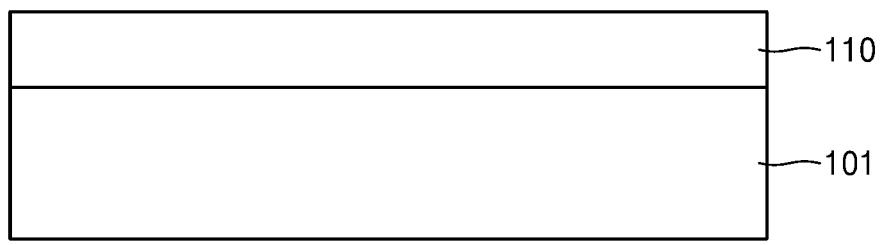
FIGS. 11A to 11J are side sectional views illustrating an embodiment of a method of forming a patterned material layer on a substrate.

Referring to FIGS. 10A and 11A, an etched layer 110 may be formed on a substrate 101 in operation S100.

The substrate 101 may include Si, for example, crystalline Si, polycrystalline Si, or amorphous Si. In other embodiments, the substrate 101 may be or include a semiconductor such as Ge or a compound semiconductor such as SiGe, SiC, GaAs, InAs, or InP. In some embodiments, the substrate 101 may have a silicon on insulator (SOI) structure. For example, the substrate 101 may include a buried oxide (BOX) layer. In some embodiments, the substrate 101 may include a conductive region, for example, a well doped with impurities or a structure doped with impurities.

In addition, semiconductor devices such as transistors or diodes may be formed on the substrate 101. In addition, a plurality of wiring lines may be arranged on the substrate 101 in multiple layers and may be electrically isolated from one another by an interlayer insulating layer.

The etched layer 110 may include a conductive layer, a dielectric layer, an insulating layer, or a combination of the above layers. For example, the etched layer 110 may include a metal, an alloy, metal carbide, metal nitride, metal oxynitride, metal oxycarbide, semiconductor, polysilicon, oxide, nitride, oxynitride, or a combination of the above materials. However, the inventive concept is not limited thereto.

Figure 11B:
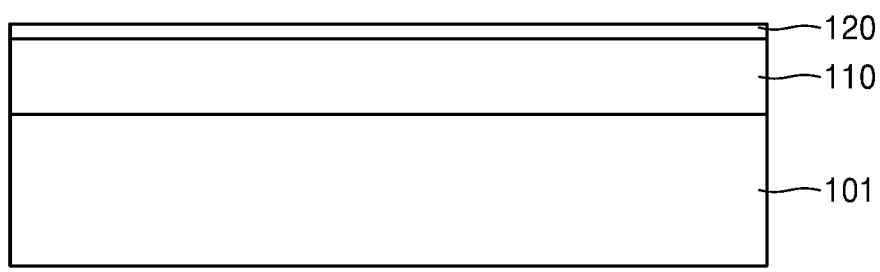

Referring to FIGS. 10A and 11B, an antireflection layer 120 may be formed on the etched layer 110.

The antireflection layer 120 may prevent total reflection of light in a subsequent exposure process. The antireflection layer 120 may include an organic component in an absorbance structure and a solvent for dispersing the organic component. The absorbance structure may be, for example, a hydrocarbon compound in a structure in which one or more benzene rings are fused.

The antireflection layer 120 may be formed by, for example, the spin coating method. However, the inventive concept is not limited thereto.

Figure 11C:
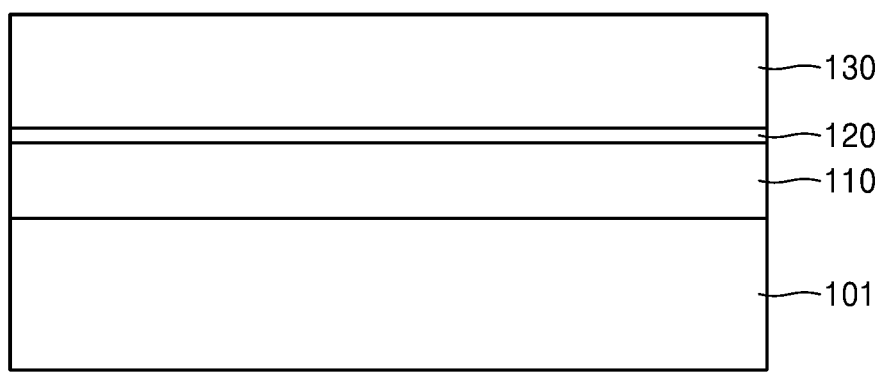

Referring to FIGS. 10A and 11C, an EUV photoresist layer 130 may be formed on the antireflection layer 120 in operation S200.

The EUV photoresist layer 130 may be formed by the spin coating method, the spray coating method, or the deep coating method. The EUV photoresist layer 130 may be formed to a thickness of, for example, about 30 nm to about 150 nm. After forming the EUV photoresist layer 130, a soft baking process may be performed at a temperature of about 80° C. to about 130° C. for about 40 seconds to about 100 seconds.

Because the material of the EUV photoresist layer 130 is described in detail with reference to FIG. 2, description thereof will not be given here in the interest of brevity.

Figure 11D:
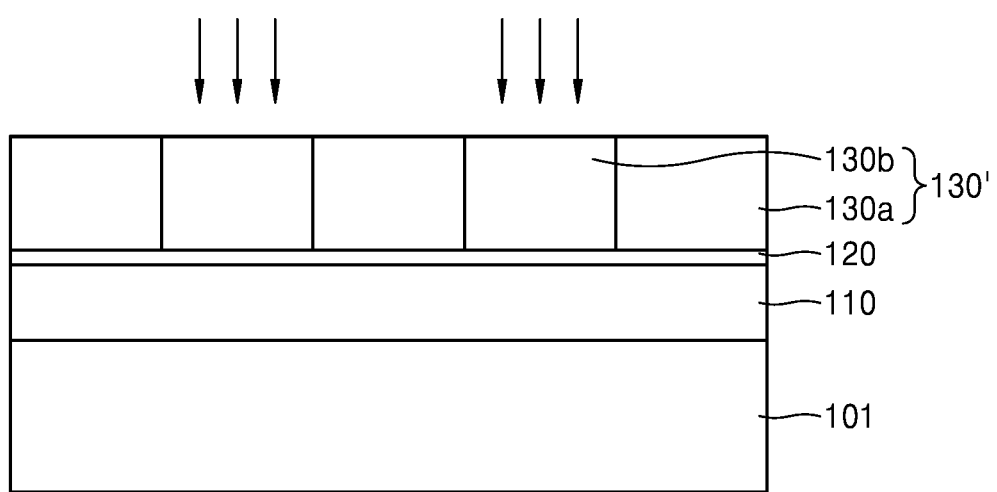

Referring to FIGS. 10A and 11D, the EUV photoresist layer 130 may be exposed by using the EUV optical system illustrated in FIG. 3 in operation S300.

In accordance with a kind of used photoresist, an exposed portion may be removed by developing or an unexposed portion may be removed by developing. Here, the unexposed portion is illustrated as being removed by negative tone developer (NTD) later. A person skilled in the art may understand that the exposed portion may be removed by NTD.

An exposed EUV photoresist layer 130' may be divided into an exposed portion 130b and an unexposed portion 130a. In the exposed portion 130b, EUV generates acid from a photoacid generator included in the EUV photoresist layer 130' so that photosensitive polymer is deprotected. On the other hand, because EUV is not irradiated onto the unexposed portion 130a, such a chemical reaction does not occur in the unexposed portion 130a.

Due to deprotection of photosensitive polymer, for example, an ester group (—COOR) before being exposed may be converted in a carboxyl group (—COOH). R combined with the ester group may be a protecting group described above.

Figure 11E:
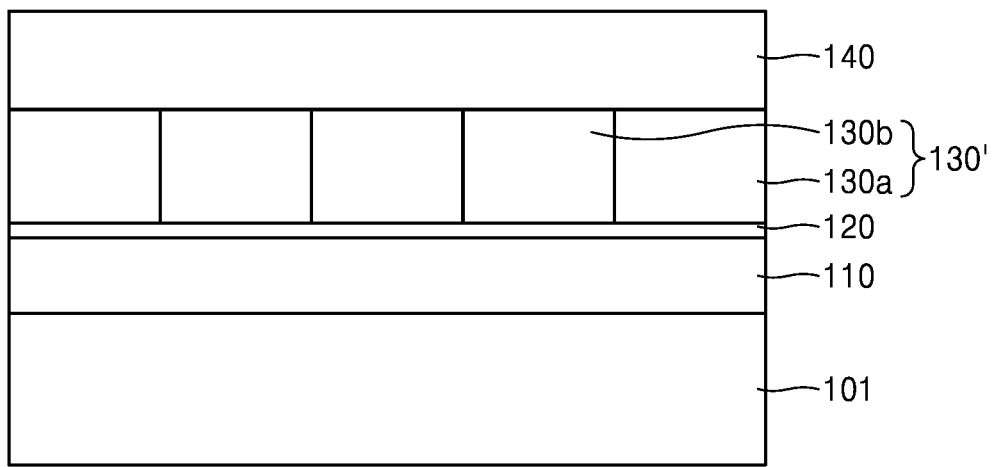

Referring to FIGS. 10A and 11E, the EUV photoresist layer 130' may be developed in operation S400.

The EUV photoresist layer 130' may be developed by using developer such as the nonpolar organic solvent. Because developer and a method of coating the same are described in detail with reference to FIG. 2, description thereof will not be given here in the interest of brevity.

In order to develop the EUV photoresist layer 130', a developer layer 140 may be formed on the EUV photoresist layer 130'. Because developer of the developer layer 140 is not exposed to EUV and has high miscibility with polymer maintaining a protecting group, an unexposed portion dissolves in the developer layer 140. In addition, because a portion exposed to EUV is deprotected, miscibility with developer deteriorates.

Figure 11F:
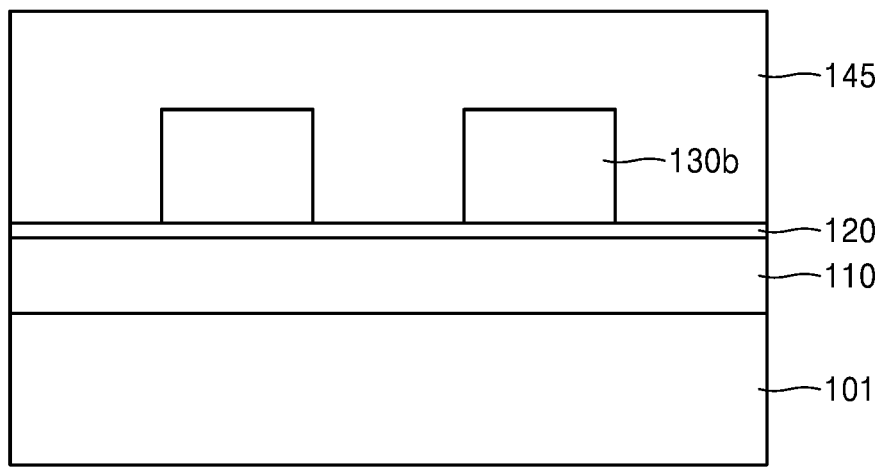

Referring to FIGS. 10A and 11F, a developer layer 145 mixed with the dissolved unexposed portion 130a is obtained. Developer of the developer layer 145 may have first concentration.

Because the exposed portion 130b does not dissolve in developer of the developer layer 145, the exposed portion 130b remains as it is.

Hereinafter, referring to FIGS. 10A and 10B together, a process of removing developer and drying a photoresist pattern is described in operation S500.

Figure 11G:
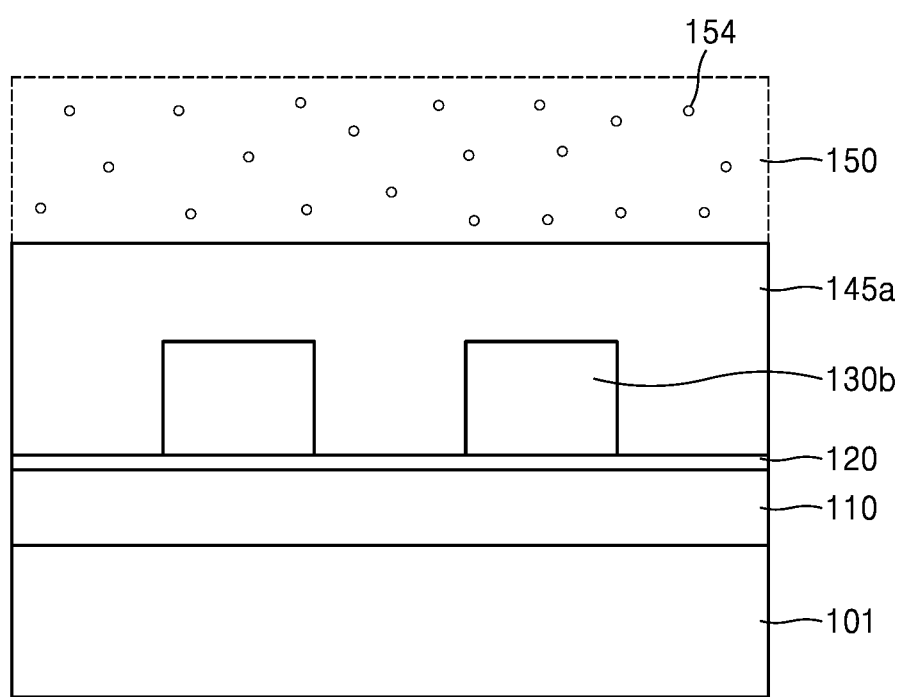

Referring to FIGS. 10A, 10B, and 11G, supercritical fluid 150 at a low temperature under the first condition is supplied on a substrate in operation S110.

Because the supercritical fluid 150 under the first condition is in the supercritical state and has a low temperature, chemical activity of developer is limited. Therefore, in comparison with supercritical fluid at a high temperature, reaction between a part of the deprotected exposed portion 130b and developer is suppressed.

On the other hand, because the supercritical fluid 150 has high miscibility with developer, the supercritical fluid 150 is dissolved and diffused into a developer layer 145a. In addition, developer in the developer layer 145a may be vaporized toward and diffused into the supercritical fluid 150. The vaporized developer 154 may be diffused into a bulk of the supercritical fluid 150 in accordance with a gradient of concentration.

As a result, concentration of developer in the developer layer 145a may be reduced with the lapse of time and developer may have second concentration lower than the first concentration.

Figure 11H:
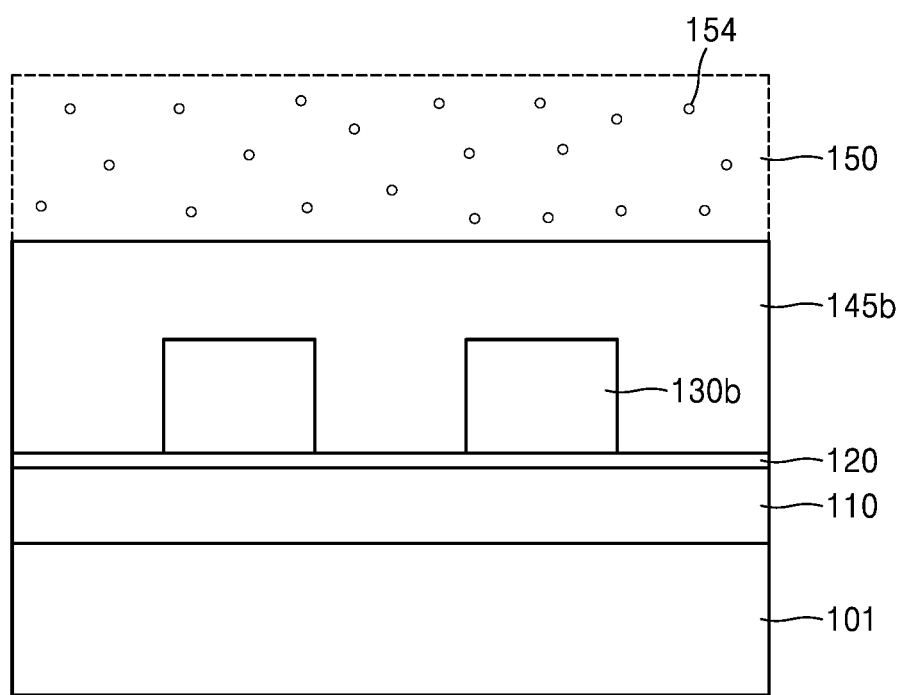

Referring to FIGS. 10A, 10B, and 11H, supercritical fluid 150 at a high temperature under the second condition is supplied on a substrate in operation S120.

Because the supercritical fluid 150 under the first condition has a relatively low temperature, however, concentration of developer in a developer layer 145b is low, reaction between a part of the deprotected exposed portion 130b and developer may be suppressed.

Because the temperature of the supercritical fluid 150 is high, miscibility with developer may increase so that transmission of a material between the supercritical fluid 150 and the developer layer 145b may become more active.

As described above with reference to FIG. 7, by repeatedly performing pressurization and depressurization on supercritical fluid, the developer layer 145b may be gradually removed in operation S130. Because the pressurization and depressurization cycle of supercritical fluid is described in detail with reference to FIGS. 7 to 9, description thereof will not be given here in the interest of brevity.

Figure 11I:
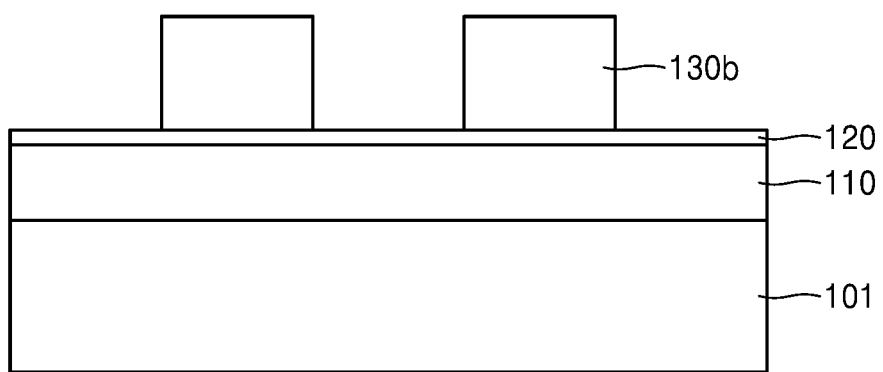

Referring to FIGS. 10B and 11I, after sufficiently removing the developer layer 145b, the supercritical fluid 150 may be discharged and removed from the processing chamber 530 in operation S140. The supercritical fluid 150 may be removed by the discharge device 560.

Then, concentration of developer is measured by using the concentration measuring device 550 (refer to FIG. 4) and, when it is determined that the concentration of developer is higher than the allowable value, the processing chamber 530 may be purged by the purge gas in operation S150.

Because operation S140 and operation S150 are described in detail with reference to FIGS. 4 and 7, detailed description thereof will not be given here in the interest of brevity.

When the concentration of developer in the processing chamber 530 is sufficiently low, the substrate may be discharged from the processing chamber 530 and the processing chamber 530 may be preprocessed in operation S160, which will be described in more detail below.

Figure 11J:
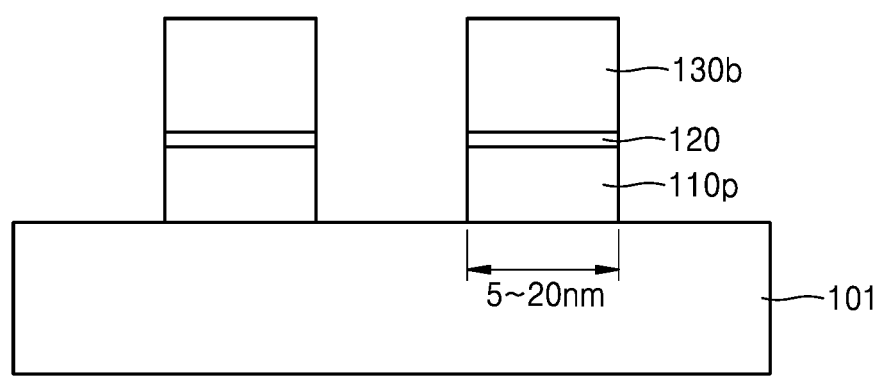

Referring to FIGS. 10A and 11J, a fine pattern 110p may be formed by patterning the etched layer 110 by anisotropic etching by using the exposed portion 130b as an etching mask in operation S600. At this time, the exposed antireflection layer 120 may be removed. The etched layer 110 may be patterned by a plasma etching method, a reactive ion etching (RIE) method, or an ion beam etching method and the inventive concept is not limited thereto.

Then, the exposed portion 130b and the antireflection layer 120 on the fine pattern 110p are removed and the final fine pattern 110p may be obtained. The fine pattern 110p may have a width of about 5 nm to about 20 nm. In some embodiments, the fine pattern 110p may have a width of about 3 nm to about 20 nm.

The fine pattern 110p obtained by etching the etched layer 110 may include various elements required for implementing an integrated circuit device. For example, the fine pattern 110p may be an active region defined in a substrate of a semiconductor device. In another example, the fine pattern 110p may include a plurality of contact hole patterns or a line and space pattern. In another example, the fine pattern 110p may include a conductive pattern or an insulating pattern. For example, the conductive pattern may configure a plurality of bit line forming patterns, a plurality of direct contact forming patterns, a plurality of buried contact forming patterns, and a plurality of capacitor lower electrode forming patterns arranged in a cell array region of the integrated circuit device or a plurality of conductive patterns arranged in a core region of the integrated circuit device.

Figure 12:
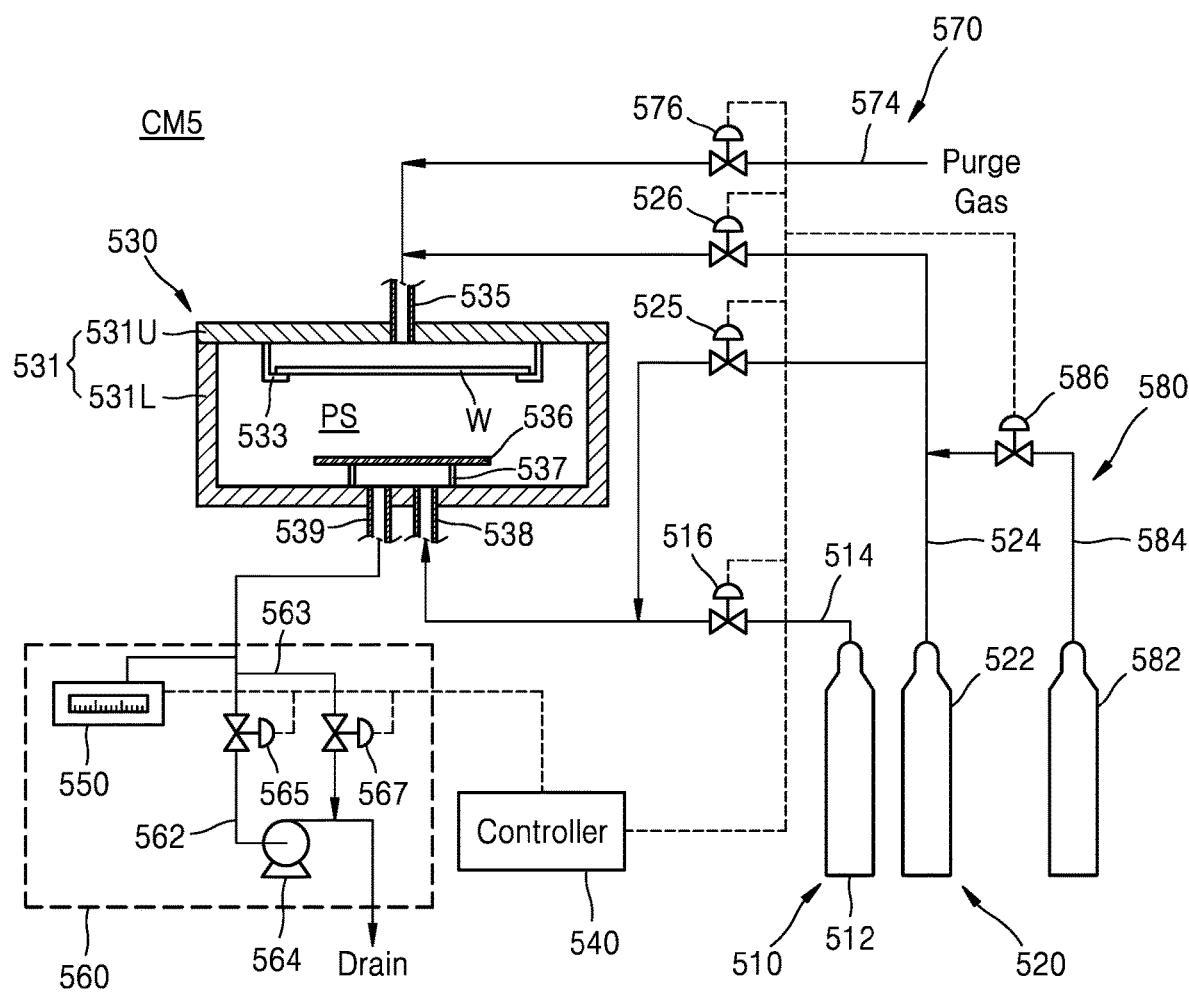
FIG. 12 is a schematic diagram illustrating a fifth chamber module according to another embodiment of the inventive concept.

FIG. 12 is a schematic diagram illustrating a fifth chamber module CM5 according to another embodiment of the inventive concept. The fifth chamber module CM5 of FIG. 12 is different from the fifth chamber module CM5 of FIG. 4 in that a preprocessing device 580 is further included. Therefore, hereinafter, description will be given based on such a difference and previously given description will not be given in the interest of brevity.

Referring to FIG. 12, the preprocessing device 580 may include a third storage tank 582 maintaining supercritical fluid under a third condition, a preprocessing conduit 584 connecting the third storage tank 582 to the processing chamber 530, and a preprocessing control valve 586 controlling flow of supercritical fluid flowing through the preprocessing conduit 584.

Supercritical fluid may be $CO_2$ in the supercritical state and a temperature of the third condition may be about 70° C. to about 120° C. and pressure of the third condition may be about 80 bar to about 150 bar. In some embodiments, the temperature and/or pressure of the third condition may be higher than those of the first condition. In some embodiments, the temperature and/or pressure of the third condition may be equal to those of the second condition.

The preprocessing control valve 586 may be controlled by the control device 540. The control device 540 may control the preprocessing of the processing chamber 530 by opening and closing the preprocessing control valve 586.

Because the preprocessing device 580 of FIG. 12 uses supercritical fluid, the preprocessing may be performed in a state in which the processing chamber 530 is closed excluding a conduit for in and out movement of supercritical fluid.

Figure 13:
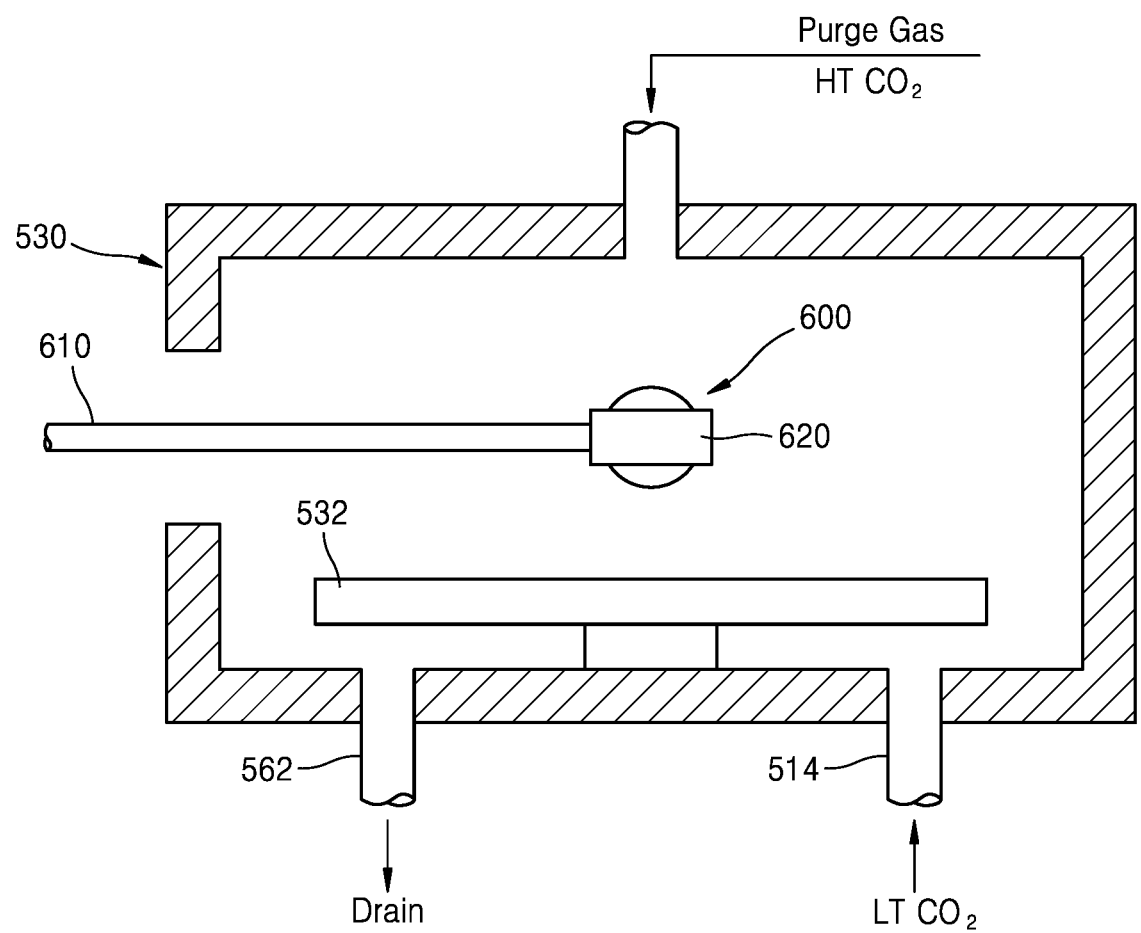
FIG. 13 is a schematic diagram illustrating a preprocessing device according to another embodiment of the inventive concept.

FIG. 13 is a schematic diagram illustrating a preprocessing device 600 according to another embodiment of the inventive concept.

Referring to FIG. 13, the preprocessing device 600 may be inserted into the internal space of the processing chamber 530 through an inlet through which a substrate may be loaded in and out.

The preprocessing device 600 may include a preprocessing arm 610 and a heater or a light irradiation device 620 provided at an end thereof. The heater or the light irradiation device 620 may have organic particles in the processing chamber 530 decomposed by radiating heat or light. Because the preprocessing device 600 is used in a state in which the preprocessing arm 610 extends from the outside to the internal space of the processing chamber 530, while performing the preprocessing, the inlet of the processing chamber 530 may be opened.

Figure 14A:
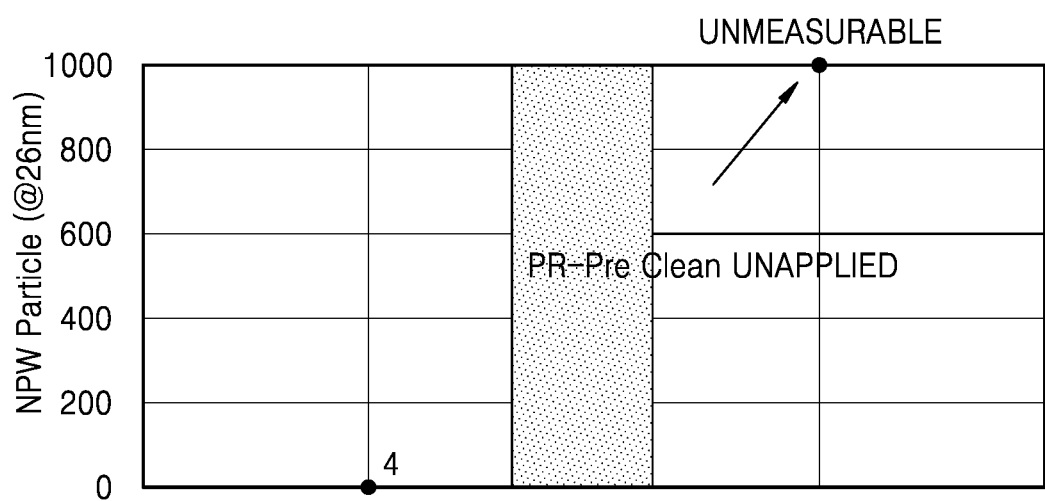
FIGS. 14A and 14B are charts illustrating a change in the number of particles between when preprocessing is not applied to a non-patterned wafer (NPW) and when preprocessing is applied to a NPW.
Figure 14B:
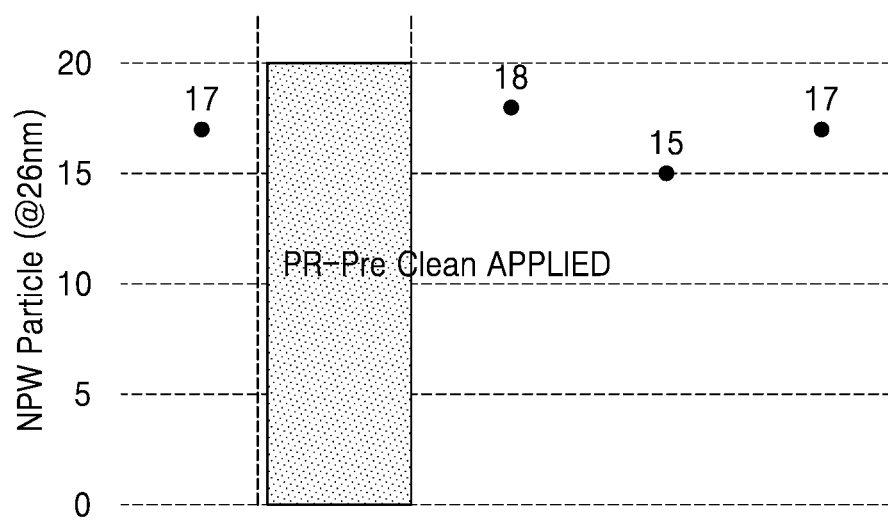

FIGS. 14A and 14B are charts illustrating a change in the number of particles between when preprocessing is not applied to a non-patterned wafer (NPW) and when preprocessing is applied to a NPW.

Referring to FIG. 14A, when the NPW is repeatedly processed without performing the preprocessing, the number of particles on the NPW increases beyond measure.

On the other hand, referring to FIG. 14B, when preprocessing is performed by using supercritical fluid at a high temperature as illustrated in FIG. 12 and the NPW is repeatedly processed, the number of particles does not significantly change in comparison with the number of particles before being preprocessed and a measured value is maintained within 20.

Figure 15:
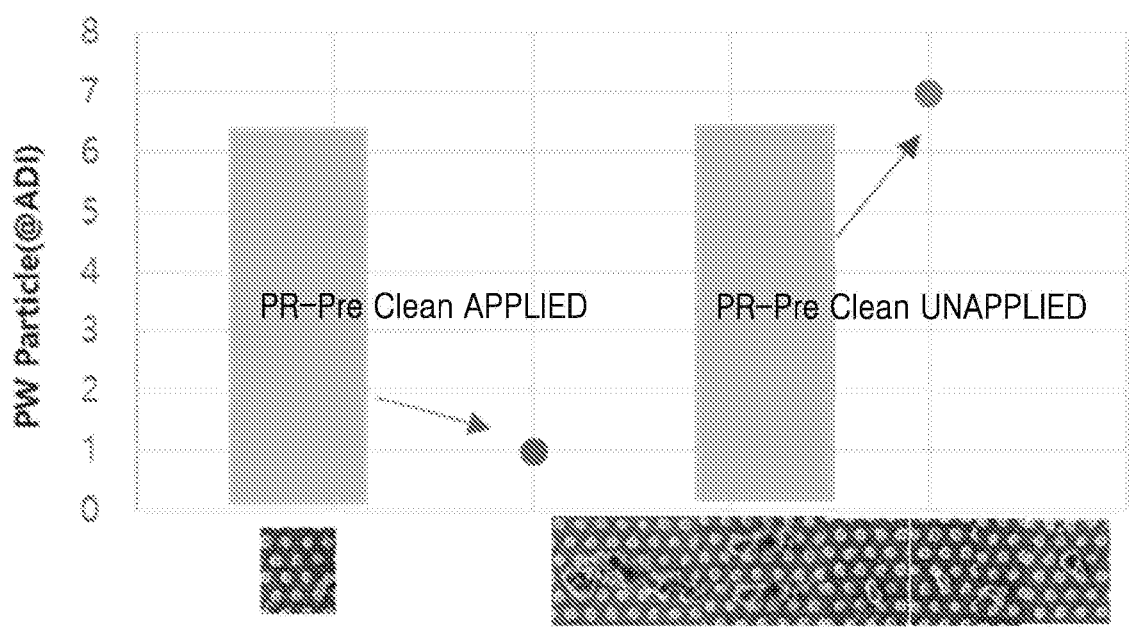
FIG. 15 is a chart illustrating a change in the number of particles between when preprocessing is not applied to a patterned wafer (PW) and when preprocessing is applied to a PW.

FIG. 15 is a chart illustrating a change in the number of particles between when preprocessing is not applied to a patterned wafer (PW) and when preprocessing is applied to a PW.

As illustrated in FIG. 15, when the preprocessing is not applied, the number of particles markedly increases in comparison with the number of particles when the preprocessing is applied.

Figure 16:
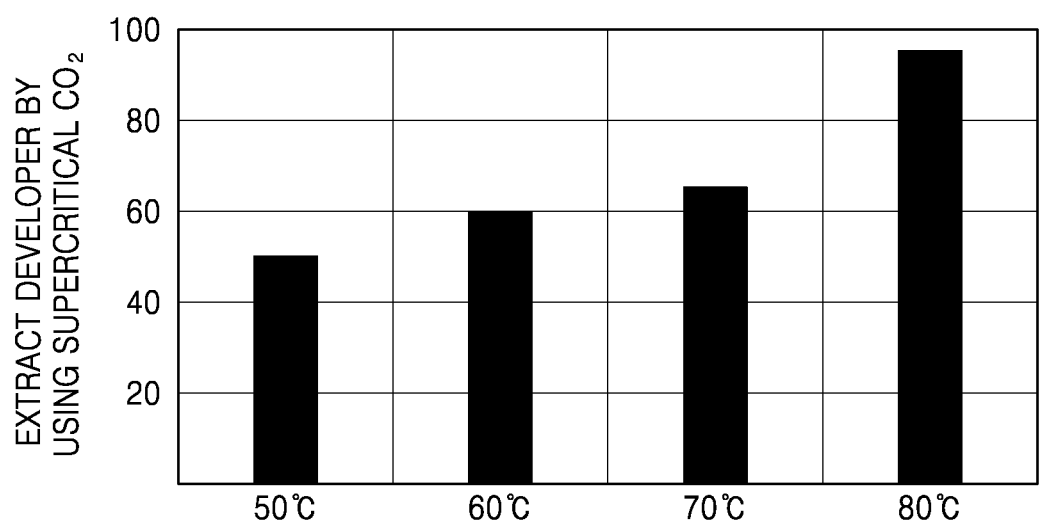
FIG. 16 is a chart illustrating a relative removal amount of developer in accordance with a preprocessing temperature.

FIG. 16 is a chart illustrating a relative removal amount of developer in accordance with a preprocessing temperature.

Referring to FIG. 16, ratios of developer removed by supercritical fluid are illustrated while changing temperatures of supercritical fluid used for the preprocessing to 50, 60, 70, and 80. Here, as a ratio of developer extraction is higher, more developer is extracted, which means a less amount of developer remains in the processing chamber.

When the temperature of supercritical fluid used for the preprocessing is 50° C. to 70° C., the ratio of developer extraction is no more than 79%. However, when the temperature of supercritical fluid is 80° C., the ratio of developer extraction is greater than 90%.

When the substrate processing apparatus, the semiconductor manufacturing equipment, and the substrate processing method according to the inventive concept are used, it is possible to remarkably reduce the amount of generated particles and loss of photoresist.

While the inventive concept has been particularly shown and described with reference to embodiments thereof, it will be understood that various changes in form and details may be made therein without departing from the scope of the following claims.

What is claimed is:

1. A substrate processing method comprising:
   receiving a substrate including an extreme ultraviolet (EUV) photoresist layer exposed to EUV and developer for developing the EUV photoresist layer into a processing chamber;
   supplying supercritical fluid under a first condition to the processing chamber; and
   supplying supercritical fluid under a second condition to the processing chamber,
   wherein the supplying of supercritical fluid under the first condition is performed before the supplying of supercritical fluid under the second condition, and
   wherein a temperature of supercritical fluid under the first condition is lower than that of supercritical fluid under the second condition,
   the method further comprising unloading the substrate out of the processing chamber and preprocessing the processing chamber,
   wherein the preprocessing is performed by supplying supercritical fluid at a temperature of about 70° C. to about 120° C. and with pressure of about 80 bar to about 150 bar to the processing chamber.

2. The substrate processing method of claim 1,
   wherein a temperature of the first condition is about 35° C. to about 70° C. and a temperature of the second condition is about 70° C. to about 120° C.

3. The substrate processing method of claim 2,
   wherein pressure of the first condition is about 75 bar to about 90 bar and pressure of the second condition is about 80 bar to about 150.

4. The substrate processing method of claim 1,
   further comprising repeatedly performing a cycle of pressurizing and depressurizing the processing chamber after the supplying of supercritical fluid under the second condition.

5. The substrate processing method of claim 4,
   further comprising discharging supercritical fluid in the processing chamber and purging the processing chamber with a purge gas after the repeatedly performing of the cycle.

6. The substrate processing method of claim 5,
   wherein the preprocessing is performed after the purging of the processing chamber.

7. The substrate processing method of claim 1,
   wherein the preprocessing is performed by applying heat and/or light inside the processing chamber.

8. The substrate processing method of claim 1,
   before the receiving the substrate into the processing chamber, further comprising:
   forming an EUV photoresist layer on a surface of the substrate;

exposing the EUV photoresist layer to EUV using a photo mask; and providing developer onto the exposed EUV photoresist layer.

9. The substrate processing method of claim 8, wherein the developer is an acetate-based developer.

10. A substrate processing apparatus comprising:
a processing chamber providing a processing space for processing a substrate;
a substrate support configured to support the substrate loaded in the processing space;
a blocking plate provided below the substrate support and configured to prevent supercritical fluid from being directly sprayed onto the substrate;
a first supply device configured to supply supercritical fluid under a first condition to the processing chamber;
a second supply device configured to supply supercritical fluid under a second condition at a higher temperature than that of supercritical fluid under the first condition to the processing chamber;
a discharge device configured to discharge supercritical fluid from the processing chamber; and
a control device configured to control operations of the first supply device, the second supply device, and the discharge device,
wherein the control device is configured to have the first supply device supply supercritical fluid prior to the second supply device, and further comprising
a purge gas supply device configured to supply a purge gas to the processing chamber,
wherein the discharge device further comprises a concentration measuring device configured to measure concentration of developer in an exit of the processing chamber, and
wherein the control device is configured to control the purge gas supply device to supply the purge gas to the processing chamber when concentration of developer measured by the concentration measuring device is greater than an allowable value.

11. The substrate processing apparatus of claim 10, wherein the control device is configured to perform a cycle of pressurizing and depressurizing the processing chamber 2 to 15 times.

12. The substrate processing apparatus of claim 11, wherein the control device is configured to discharge supercritical fluid in the processing chamber through the discharge device after the cycle is terminated.

13. The substrate processing apparatus of claim 11, wherein the pressurization and depressurization are performed in a range of a temperature of about 70° C. to about 120° C. and pressure of about 80 bar to about 150 bar.

14. The substrate processing apparatus of claim 11, wherein the pressurization and depressurization is configured to go back and forth between a first zone defined by a range of a temperature of about 35° C. to about 70° C. and pressure of about 75 bar to about 90 bar and a second zone defined by a range of a temperature of about 70° C. to about 120° C. and pressure of about 80 bar to about 150 bar.

15. The substrate processing apparatus of claim 14, wherein the control device is configured to supply supercritical fluid under the second condition to the processing chamber for the pressurization and to discharge supercritical fluid from the processing chamber for the depressurization.

16. A substrate processing method comprising:
forming a to-be-etched layer and an antireflection layer on a substrate;
forming an extreme ultraviolet (EUV) photoresist layer on the substrate;
exposing the EUV photoresist layer to EUV using a photo mask;
providing developer onto the exposed EUV photoresist layer and taking the substrate in a processing chamber;
supplying supercritical fluid under a first condition to the processing chamber;
supplying supercritical fluid under a second condition at a temperature higher than that of supercritical fluid under the first condition to the processing chamber;
forming a photoresist pattern by drying the substrate by supercritical fluid under the second condition; and
forming a pattern in the to-be-etched layer by performing etching using the photoresist pattern as an etching mask,
wherein a width of the pattern formed in the to-be-etched layer is about 5 nm to about 20 nm.

17. The substrate processing method of claim 16, wherein a temperature of the first condition is about 35° C. to about 70° C. and a temperature of the second condition is about 70° C. to about 120° C.

18. The substrate processing method of claim 17, wherein pressure of the first condition is about 75 bar to about 90 bar and pressure of the second condition is about 80 bar to about 150.

19. The substrate processing method of claim 16, further comprising repeatedly performing a cycle of pressurizing and depressurizing the processing chamber after the supplying of supercritical fluid under the second condition.

* * * * *